United States Patent
An et al.

(10) Patent No.: US 7,148,526 B1
(45) Date of Patent: Dec. 12, 2006

(54) GERMANIUM MOSFET DEVICES AND METHODS FOR MAKING SAME

(75) Inventors: Judy Xilin An, San Jose, CA (US); Zoran Krivokapic, Santa Clara, CA (US); Haihong Wang, Fremont, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 40 days.

(21) Appl. No.: 10/348,758

(22) Filed: Jan. 23, 2003

(51) Int. Cl.
*H01L 29/72* (2006.01)

(52) U.S. Cl. ............... 257/288; 257/329; 257/347; 257/365; 257/616; 257/618; 257/623

(58) Field of Classification Search .......... 257/288, 257/289, 291, 347, 348, 270, 271, 351, 355, 257/329, 365, 616, 618, 623
See application file for complete search history.

(56) References Cited

U.S. PATENT DOCUMENTS

| | | | |
|---|---|---|---|
| 4,317,125 A | 2/1982 | Hughes et al. .......... 357/15 |
| 4,979,014 A | 12/1990 | Hieda et al. .......... 357/56 |
| 5,315,143 A | 5/1994 | Tsuji .............. 257/351 |
| 5,563,082 A | 10/1996 | Mukai ............. 437/41 |
| 5,739,057 A | 4/1998 | Tiwari et al. .......... 438/172 |
| 6,107,141 A | 8/2000 | Hsu et al. ........... 438/267 |
| 6,159,782 A | 12/2000 | Xiang et al. |
| 6,300,182 B1 | 10/2001 | Yu |
| 6,333,247 B1 | 12/2001 | Chan et al. .......... 438/586 |
| 6,359,311 B1 | 3/2002 | Colinge et al. ........ 257/347 |
| 6,396,108 B1 | 5/2002 | Krivokapic et al. .... 257/365 |
| 6,413,802 B1 | 7/2002 | Hu et al. ........... 438/151 |
| 6,433,609 B1 | 8/2002 | Voldman ........... 327/313 |
| 6,458,662 B1 | 10/2002 | Yu |
| 6,472,258 B1 | 10/2002 | Adkisson et al. ....... 438/192 |
| 6,483,171 B1 | 11/2002 | Forbes et al. .......... 257/627 |
| 6,525,403 B1 * | 2/2003 | Inaba et al. .......... 257/618 |
| 6,528,381 B1 | 3/2003 | Lee et al. |
| 6,610,576 B1 | 8/2003 | Nowak |
| 6,611,029 B1 | 8/2003 | Ahmed et al. ......... 257/365 |
| 6,635,909 B1 | 10/2003 | Clark et al. .......... 257/192 |

(Continued)

FOREIGN PATENT DOCUMENTS

EP 0 623 963 A1 11/1994

OTHER PUBLICATIONS

Digh Hisamoto et al., "FinFET-A Self-Aligned Double-Gate MOSFET Scalable to 20 nm," IEEE Transactions on Electron Devices, vol. 47, No. 12, Dec. 2000, pp. 2320-2325.

(Continued)

*Primary Examiner*—Edward Wojciechowicz
(74) *Attorney, Agent, or Firm*—Harrity Snyder, LLP

(57) ABSTRACT

A double gate germanium metal-oxide semiconductor field-effect transistor (MOSFET) includes a germanium fin, a first gate formed adjacent a first side of the germanium fin, and a second gate formed adjacent a second side of the germanium fin opposite the first side. A triple gate MOSFET includes a germanium fin, a first gate formed adjacent a first side of the germanium fin, a second gate formed adjacent a second side of the germanium fin opposite the first side, and a top gate formed on top of the germanium fin. An all-around gate MOSFET includes a germanium fin, a first sidewall gate structure formed adjacent a first side of the germanium fin, a second sidewall gate structure formed adjacent a second side of the germanium fin, and additional gate structures formed on and around the germanium fin.

6 Claims, 29 Drawing Sheets

U.S. PATENT DOCUMENTS

| | | | |
|---|---|---|---|
| 6,657,252 B1 | 12/2003 | Fried et al. | 257/316 |
| 6,657,259 B1 | 12/2003 | Fried et al. | 257/350 |
| 6,689,650 B1 | 2/2004 | Gambino et al. | 438/157 |
| 6,812,119 B1* | 11/2004 | Ahmed et al. | 438/585 |
| 2002/0003255 A1 | 1/2002 | Usuki et al. | |
| 2002/0125536 A1 | 9/2002 | Iwasa et al. | 257/368 |
| 2002/0153587 A1 | 10/2002 | Adkisson et al. | 257/510 |
| 2002/0177263 A1 | 11/2002 | Hanafi et al. | 438/183 |
| 2003/0042531 A1* | 3/2003 | Lee et al. | 257/347 |
| 2003/0113970 A1* | 6/2003 | Fried et al. | 257/347 |
| 2004/0075121 A1* | 4/2004 | Yu et al | 257/288 |
| 2004/0108545 A1 | 6/2004 | Ando | 257/329 |
| 2004/0110331 A1* | 6/2004 | Yeo et al. | 438/100 |
| 2004/0195628 A1* | 10/2004 | Wu et al. | 257/351 |
| 2004/0251487 A1 | 12/2004 | Wu et al. | 257/315 |

OTHER PUBLICATIONS

Yang-Kyu Choi et al., "Sub-20nm CMOS FinFET Technologies," 2001 IEEE, IEDM, pp. 421-424.

Xuejue Huang et al., "Sub-50 nm P-Channel FinFET," IEEE Transactions on Electron Devices, vol. 48, No. 5, May 2001, pp. 880-886.

Xuejue Huang et al., "Sub 50-nm FinFET: PMOS," 1999 IEEE, IEDM, pp. 67-70.

Yang-Kyu Choi et al., "Nanoscale CMOS Spacer FinFET for the Terabit Era," IEEE Electron Device Letters, vol. 23, No. 1, Jan. 2002, pp. 25-27.

U.S. Appl. No. 10/348,911, filed Jan. 23, 2003; Judy Xilin An; "Tri-Gate and Gate Around Mosfet Devices and Methods for Making Same;" 35 pages.

U.S. Appl. No. 10/290,330, filed Nov. 8, 2002; Bin Yu et al.; "Double-Gate Semiconductor Device;" 31 pages.

U.S. Appl. No. 10/290,158, filed Nov. 8, 2002; Shibly Ahmed et al.; "Double Gate Semiconductor Device Having Separate Gates;" 24 pages.

U.S. Appl. No. 10/274,961, filed Oct. 22, 2002; Ming-Ren Lin et al.; "Double and Triple Gate Mosfet Devices and Methods for Making Same;" 28 pages.

Leland Chang et al.: "Gate Length Scaling and Threshold Voltage Control of Double-Gate MOSFETs," IEDM, Dec. 10, 2000, pp. 719-722.

Co-pending U.S. Appl. No. 10/770,011; Bin Yu et al.; filed Feb. 3, 2004; entitled "Double-Gate Semiconductor Device with Gate Contacts Formed Adjacent Sidewalls of a Fin", 27 pages.

U.S. Appl. No. 10/653,105, filed Sep. 3, 2003; Bin Yu et al.; Additional Gate Control For a Double-Gate Mosfet; 27pages.

U.S. Appl. No. 10/633,034, filed Aug. 4, 2003; Chih-Yuh Yang et al.; Semiconductor Device Having a Gate Structure Surrounding a Fin; 42 pages.

U.S. Appl. No. 10/602,061, filed Jun. 24, 2003; Shibly S. Ahmed; Double Gate Semiconductor Device Having Separate Gates; 24 pages.

Jong-Tae Park et al.: "Multiple-Gate SOI MOSFETs: Device Design Guidelines," IEEE Transactions on Electron Devices, vol. 49, No. 12, Dec. 2002, pp. 2222-2229.

Fu-Liang Yang et al.: "25 nm CMOS Omega FETs," International Electron Devices Meeting 2002, IEDM, Technical Digest, Dec. 8-11, 2002 in New York, NY, pp. 255-258.

Toshikazu Mukaiyama et al.: "Fabrication of Gate-All-Around MOSFET By Silicon Anisotropic Etching Technique," Solid State Electronics, Elsevier Science Publishers, vol. 42, No. 7-8, Jul. 8, 1998, pp. 1623-1626.

Yang-Kyu Choi et al.: "Spacer FinFET: nanoscale double-gate CMOS technology for the terabit era," Solid State Electronics, Elsevier Science Publishers, vol. 46, No. 10, Oct. 2002, pp. 1595-1601.

Effendi Leobandung et al.: "Wire-channel and wrap-around-gate metal-oxide-semiconductor field-effect transistors with a significant reduction of short channel effects," 41st International Conference on Electron, Ion, and Photon Beams Technology and Nanofabrication in Dana Point, CA, May 27-30, 1997, vol. 15, No. 6, Journal of Vacuum Science & Technology B (Microelectronics and Nanometer Structures), Nov.-Dec. 1997, AIP for American Vacuum Soc., pp. 2791-2794.

* cited by examiner

GERMANIUM MOSFET DEVICES AND METHODS FOR MAKING SAME

FIELD OF THE INVENTION

The present invention relates generally to semiconductor manufacturing and, more particularly, to germanium metal-oxide semiconductor field-effect transistor (MOSFET) devices and methods of making these devices.

BACKGROUND OF THE INVENTION

Scaling of device dimensions has been a primary factor driving improvements in integrated circuit performance and reduction in integrated circuit cost. Due to limitations associated with gate-oxide thicknesses and source/drain (S/D) junction depths, scaling of existing bulk MOSFET devices beyond the 0.1 µm process generation may be difficult, if not impossible. New device structures and new materials, thus, are likely to be needed to improve FET performance.

Double gate MOSFETs represent devices that are candidates for succeeding existing planar MOSFETs. In double gate MOSFETs, the use of two gates to control the channel significantly suppresses short-channel effects. A FinFET is a double gate structure that includes a channel formed in a vertical fin. Although a double gate structure, the FinFET is similar to existing planar MOSFETs in layout and fabrication techniques. The FinFET also provides a range of channel lengths, CMOS compatibility, and large packing density compared to other double gate structures.

SUMMARY OF THE INVENTION

Implementations consistent with the principles of the invention provide germanium FinFET devices and methods for manufacturing these devices.

In one aspect consistent with the principles of the invention, a double gate germanium metal-oxide semiconductor field-effect transistor (MOSFET) includes a germanium fin, a first gate formed adjacent a first side of the germanium fin, and a second gate formed adjacent a second side of the germanium fin opposite the first side.

In another aspect, a triple gate MOSFET includes a germanium fin, a first gate formed adjacent a first side of the germanium fin, a second gate formed adjacent a second side of the germanium fin opposite the first side, and a top gate formed on top of the germanium fin.

In yet another aspect, an all-around gate MOSFET includes a germanium fin, a first sidewall gate structure formed adjacent a first side of the germanium fin, a second sidewall gate structure formed adjacent a second side of the germanium fin, and additional gate structures formed on and around the germanium fin.

In a further aspect, a method for forming gates in a MOSFET includes forming a germanium fin on a substrate; and forming separate gate structures adjacent the fin.

In another aspect, a method for forming gates in a MOSFET includes forming a germanium fin on a substrate; and forming three gate structures adjacent the germanium fin.

In yet another aspect, a method for forming gates in a MOSFET includes forming a germanium fin on a substrate; forming sidewall gate structures adjacent the germanium fin; and forming a top gate structure on top of the germanium fin.

In a further aspect, a method for forming gates in a MOSFET includes forming a germanium fin on a substrate; forming a top gate structure on top of the germanium fin; forming sidewall gate structures adjacent the germanium fin; forming a bottom gate structure under the germanium fin; removing the top gate structure; and reforming the top gate structure on the germanium fin, the top gate structure connecting the plurality of sidewall gate structures.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of implementations consistent with the present invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the principles of the invention provide germanium (Ge) FinFET devices and methods for manufacturing these devices. Using germanium to form the fin provides better mobility over other materials, such as silicon or silicon germanium, and, thus, provides better drive current.

Exemplary Double Gate MOSFET

Figure 1:
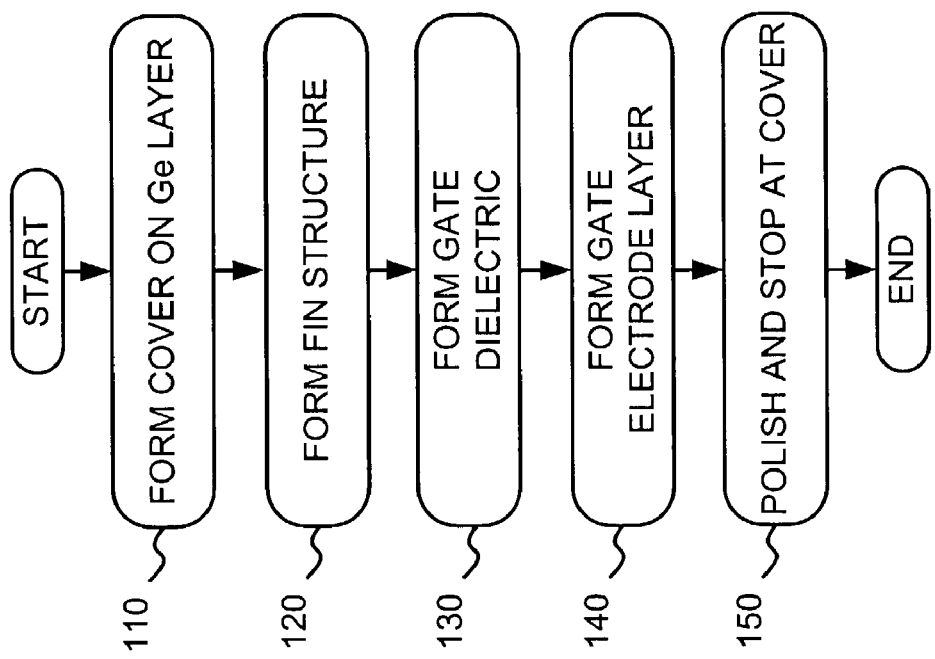
FIG. 1 illustrates an exemplary process for fabricating a germanium double gate MOSFET in an implementation consistent with the principles of the invention.

FIG. 1 illustrates an exemplary process for fabricating a germanium double gate MOSFET in an implementation consistent with the principles of the invention. FIGS. 2–6 illustrate exemplary cross-sectional views of a MOSFET fabricated according to the processing described with regard to FIG. 1.

Figure 2:
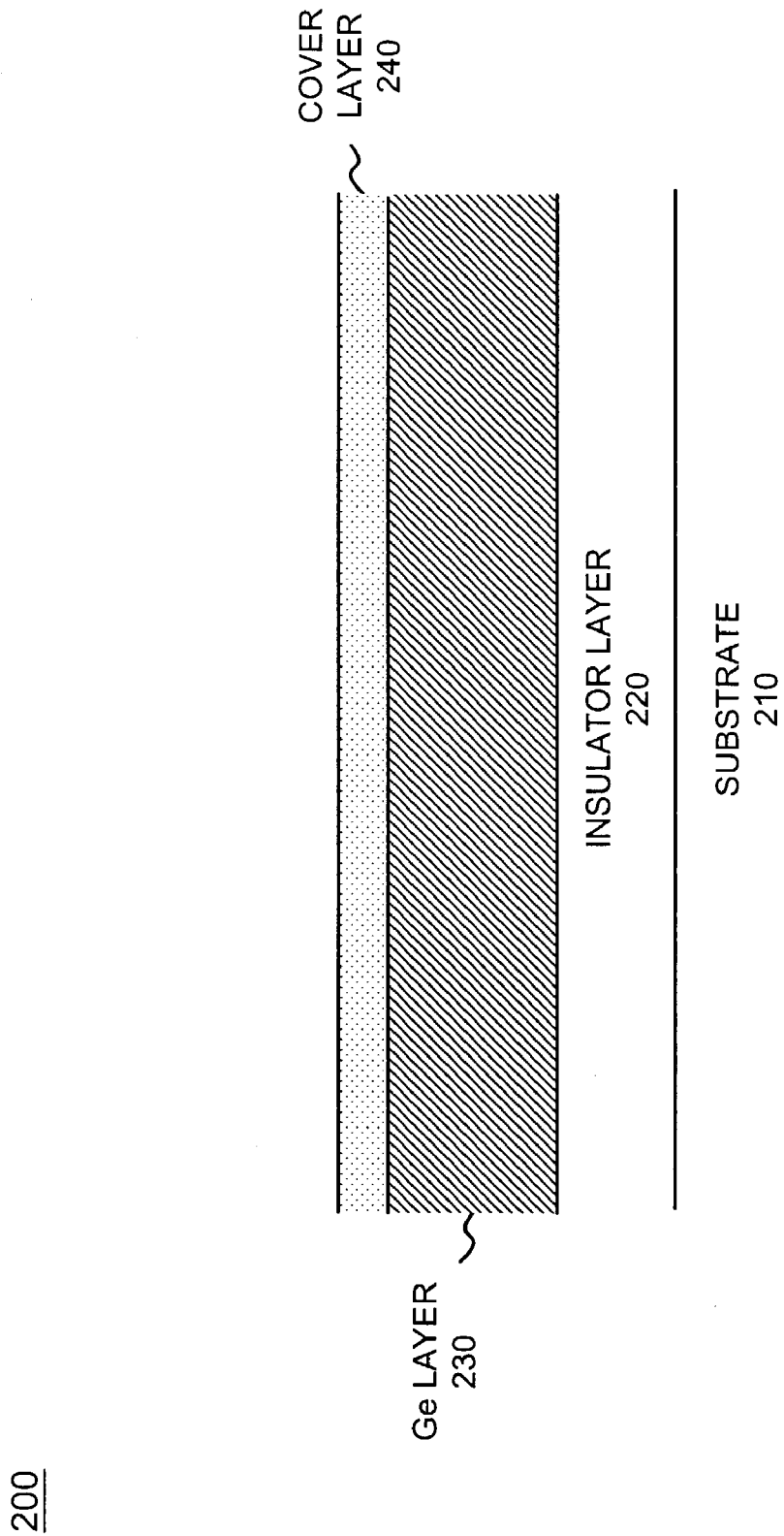
FIGS. 2–5 illustrate exemplary cross-sectional views of a germanium double gate MOSFET fabricated according to the processing described in FIG. 1.

With reference to FIGS. 1 and 2, processing may begin with semiconductor device 200. Semiconductor device 200 may include a germanium on insulator (GOI) structure that includes a substrate 210, an insulator layer 220, and a germanium (Ge) layer 230 on the insulator layer 220. Substrate 210 may include a germanium substrate and insulator layer 220 may include a buried oxide layer. Insulator layer 220 and germanium layer 230 may be formed on substrate 210 in a conventional manner. The thickness of insulator layer 220 may range, for example, from about 1000 Å to 5000 Å. The thickness of germanium layer 230 may range from about 200 Å to 2000 Å. It will be appreciated that germanium layer 230 is used to form the fin.

In alternative implementations, substrate 210 may include other semiconductor materials, such as silicon, or combinations of semiconductor materials, such as silicon germanium. Insulator layer 220 may include a silicon oxide or other types of dielectric materials.

A cover layer 240 (or hard mask) may be formed on top of germanium layer 230 to aid in pattern optimization and protect germanium layer 230 during subsequent processing (act 110). Cover layer 240 may, for example, include a silicon nitride material or some other type of material capable of protecting germanium layer 230 during the fabrication process. Cover layer 240 may be deposited, for example, by chemical vapor deposition (CVD) at a thickness ranging from approximately 200 Å to 500 Å.

Figure 3:
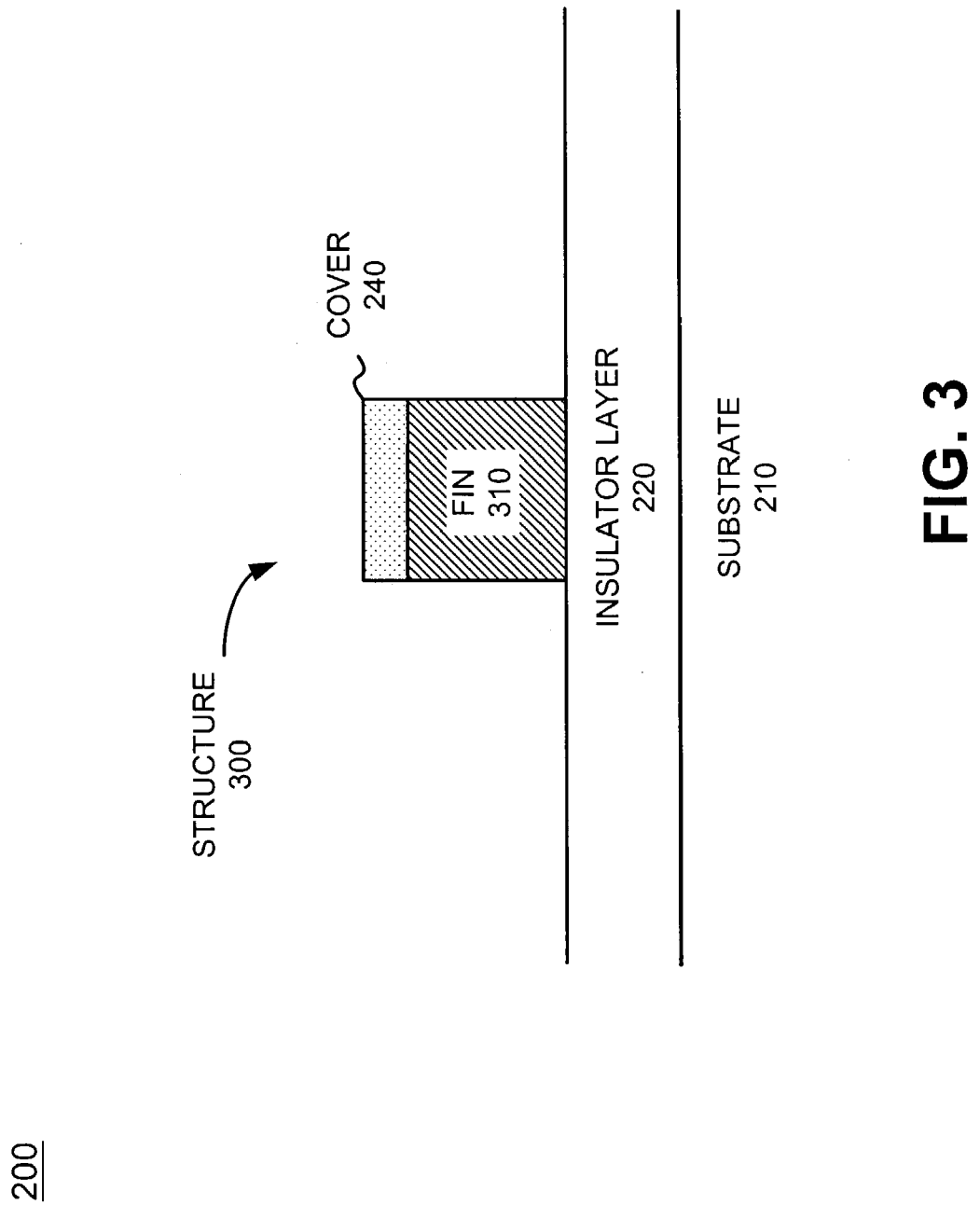

Germanium layer 230 may be patterned by conventional lithographic techniques (e.g., optical or electron beam (EB) lithography). Germanium layer 230 and cover 240 may then be etched using well-known etching techniques to form structure 300, as illustrated in FIG. 3 (act 120). Structure 300 includes fin 310 and cover 240. The width of fin 310 may range from approximately 75 Å to 350 Å.

Figure 4:
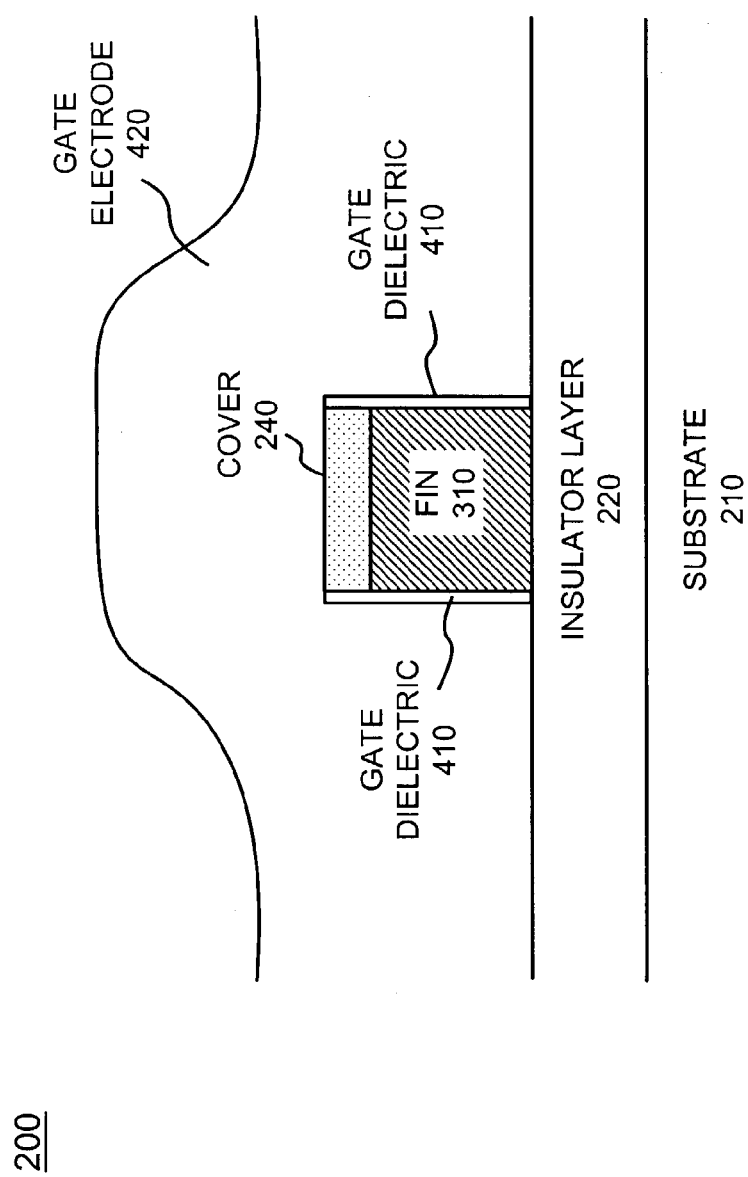

A gate dielectric material 410 may be deposited or grown on the side surfaces of structure 300 (act 130), as illustrated in FIG. 4. Gate dielectric 410 may include a high K material (with Hf, Zr, Y, La oxide) formed by atomic layer deposition (ALD) or molecular-organic chemical vapor deposition (MOCVD). Alternatively, gate dielectric 410 may include GeON. Gate dielectric material 410 may be formed at an equivalent oxide thickness (EOT) ranging from approximately 6 Å to 14 Å. Gate dielectric 410 is shown in FIG. 4 as being formed on the side surfaces of fin 310 and cover 240. In alternative implementations, gate dielectric 410 may be formed only on the side surfaces of fin 310.

A gate electrode layer 420 may be deposited over substrate 200, including fin 310 (act 140). Gate electrode layer 420 may be formed at a thickness ranging from approximately 1000 Å to 1500 Å. A number of conductive materials may be used for gate electrode layer 420. For example, gate electrode layer 420 may include a metal (e.g., tungsten, tantalum, aluminum, nickel, ruthenium, rhodium, palladium, platinum, titanium, molybdenum, etc.), a metal containing compound (e.g., titanium nitride, tantalum nitride, ruthenium oxide, etc.), or a doped semiconductor material (e.g., polycrystalline silicon, polycrystalline silicon-germanium, etc.).

Figure 5:
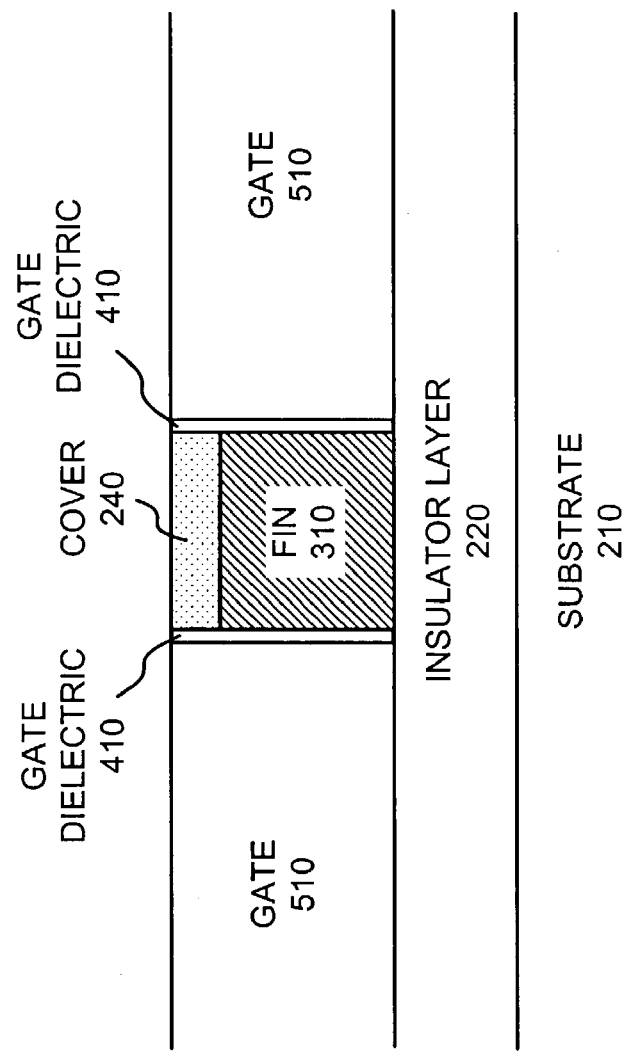

Chemical-mechanical polishing (CMP) or another comparable technique may then be performed to remove excess gate material (e.g., above cover 240) (act 150), as illustrated in FIG. 5. As a result, gate electrode 420 may be split to form two separate gate structures, namely gates 510 and 520. Advantageously, gates 510 and 520 are physically and electrically separated and may be separately biased based on the particular circuit requirements associated with the end device. Conventional MOSFET fabrication processing can then be used to complete the transistor (e.g., forming and implanting the source and drain regions), contacts, interconnects and inter-level dielectrics for the double gate MOSFET.

Exemplary Triple Gate MOSFETs

Figure 6:
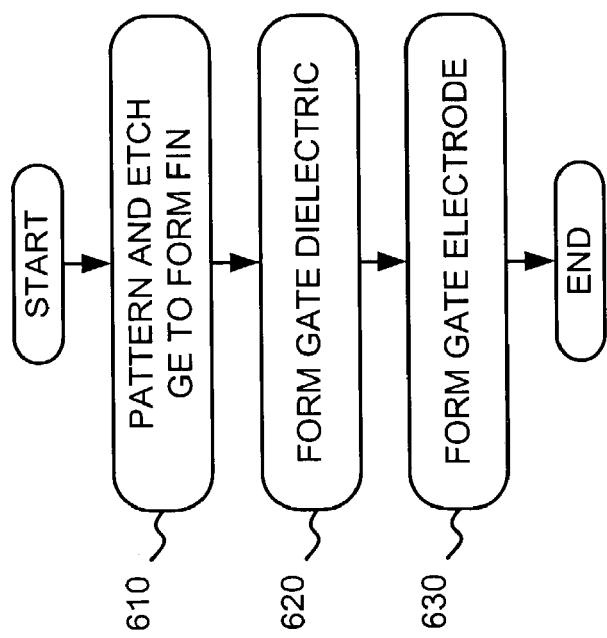
FIG. 6 illustrates an exemplary process for fabricating a germanium triple gate MOSFET in an implementation consistent with the principles of the invention.

FIG. 6 illustrates an exemplary process for fabricating a germanium triple gate MOSFET in an implementation consistent with the principles of the invention. FIGS. 7–10 illustrate exemplary cross-sectional views of a MOSFET fabricated according to the processing described with regard to FIG. 6.

Figure 7:
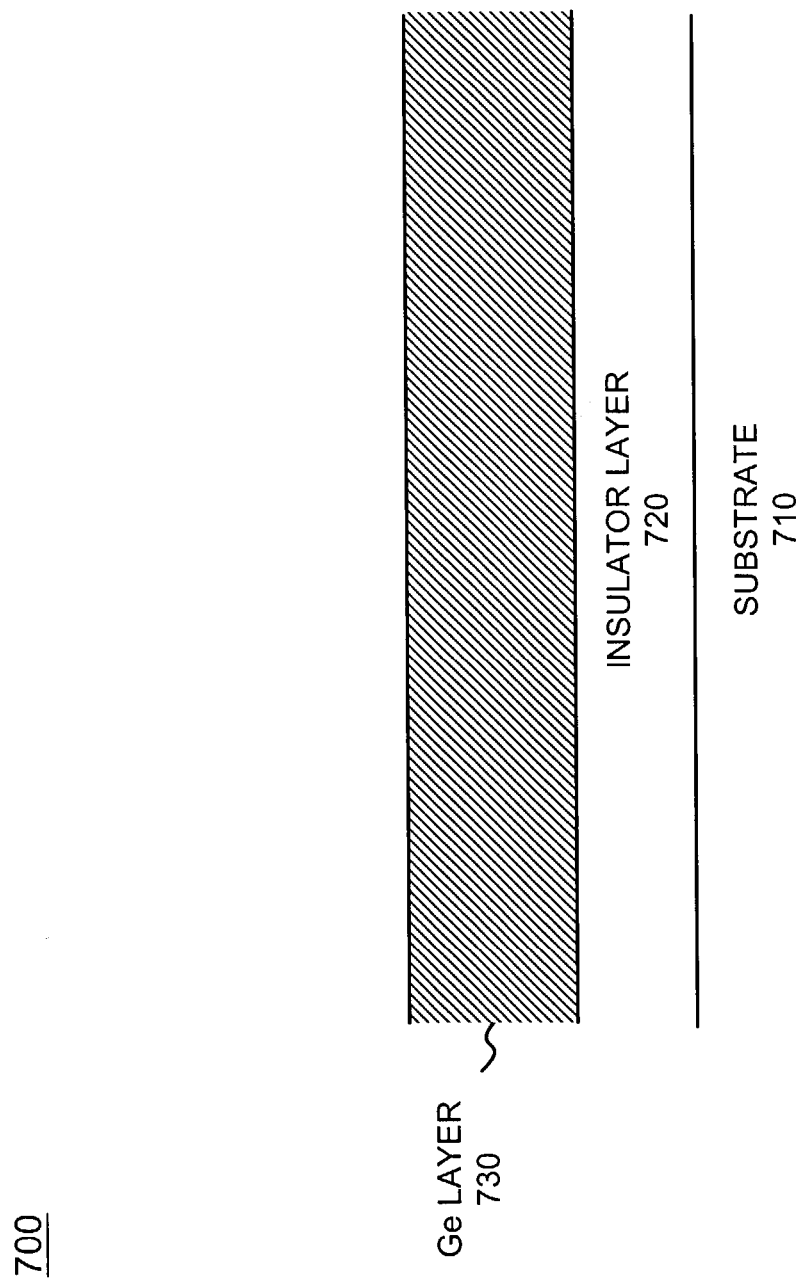
FIGS. 7–10 illustrate exemplary cross-sectional views of a germanium triple gate MOSFET fabricated according to the processing described in FIG. 6.

With reference to FIGS. 6 and 7, processing may begin with semiconductor device 700. Semiconductor device 700 may include a GOI structure that includes a substrate 710, an insulator layer 720, and a germanium (Ge) layer 730 on the insulator layer 720. Substrate 710 may include a germanium substrate and insulator layer 720 may include a buried oxide layer. Insulator layer 720 and germanium layer 730 may be formed on substrate 710 in a conventional manner. The thickness of insulator layer 720 may range, for example, from about 1000 Å to 5000 Å. The thickness of germanium layer 730 may range from about 200 Å to 2000 Å. It will be appreciated that germanium layer 730 is used to form the fin.

In alternative implementations, substrate 710 may include other semiconductor materials, such as silicon, or combinations of semiconductor materials, such as silicon germanium. Insulator layer 720 may include a silicon oxide or other types of dielectric materials.

Figure 8:
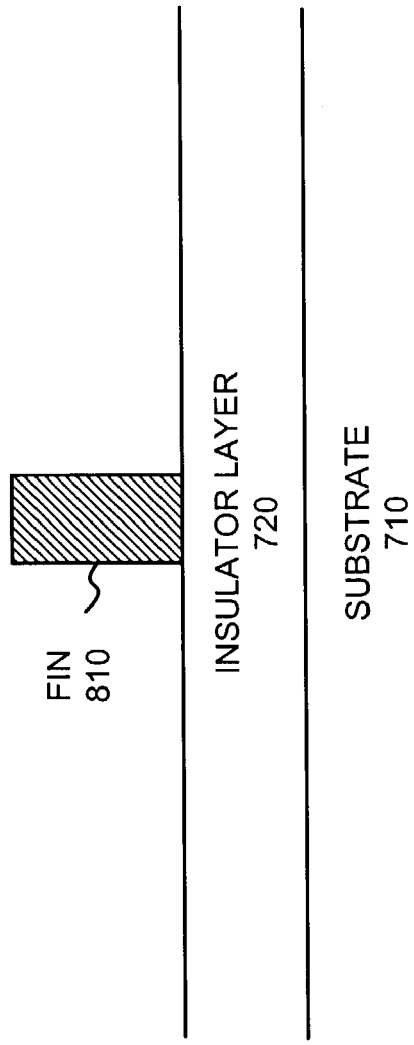

Germanium layer 730 may be patterned by conventional lithographic techniques (e.g., electron beam (EB) lithography). Germanium layer 730 may then be etched using well-known etching techniques to form fin 810, as illustrated in FIG. 8 (act 610). The width of fin 810 may range from approximately 75 Å to 350 Å.

Figure 9:
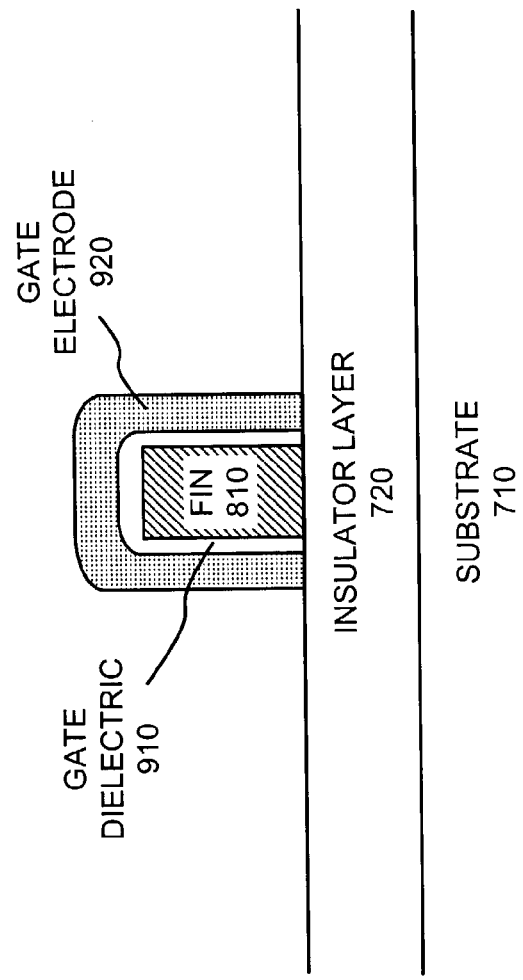

A gate dielectric layer 910 may be deposited or grown on the surfaces of fin 810 (act 620), as illustrated in FIG. 9. Gate dielectric 910 may include a high K material (with Hf, Zr, Y, La oxide) formed by ALD or MOCVD. Alternatively, gate dielectric 910 may include GeON. Gate dielectric layer 910 may be formed at an EOT ranging from approximately 6 Å to 14 Å.

Figure 10:
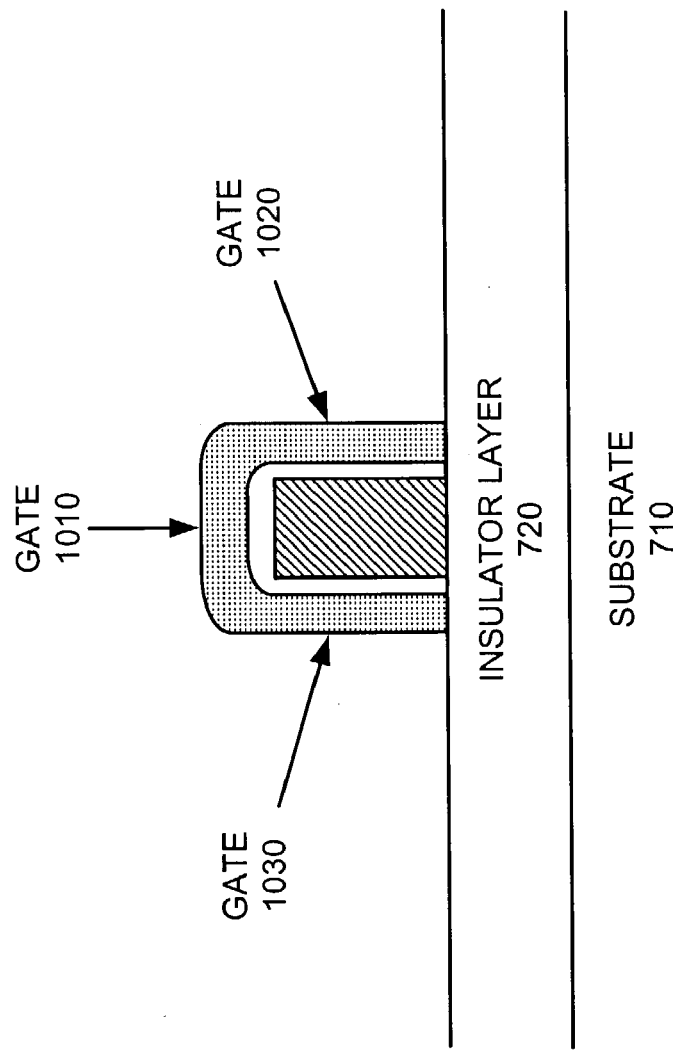

A gate electrode layer 920 may be formed over gate dielectric layer 910, including fin 810 (act 630), as illustrated in FIG. 9. Gate electrode layer 920 may be formed at a thickness ranging from approximately 1000 Å to 1500 Å. A number of conductive materials may be used for gate electrode layer 920. For example, gate electrode layer 920 may include a metal (e.g., tungsten, tantalum, aluminum, nickel, ruthenium, rhodium, palladium, platinum, titanium, molybdenum, etc.), a metal containing compound (e.g., titanium nitride, tantalum nitride, ruthenium oxide, etc.), or a doped semiconductor material (e.g., polycrystalline silicon, polycrystalline silicon-germanium, etc.). The resulting semiconductor device 700 may include three gates: gate 1010, gate 1020, and gate 1030, as illustrated in FIG. 10.

Conventional MOSFET fabrication processing can then be used to complete the transistor (e.g., forming and implanting the source and drain regions), contacts, interconnects and inter-level dielectrics for the triple gate MOSFET.

Figure 11:
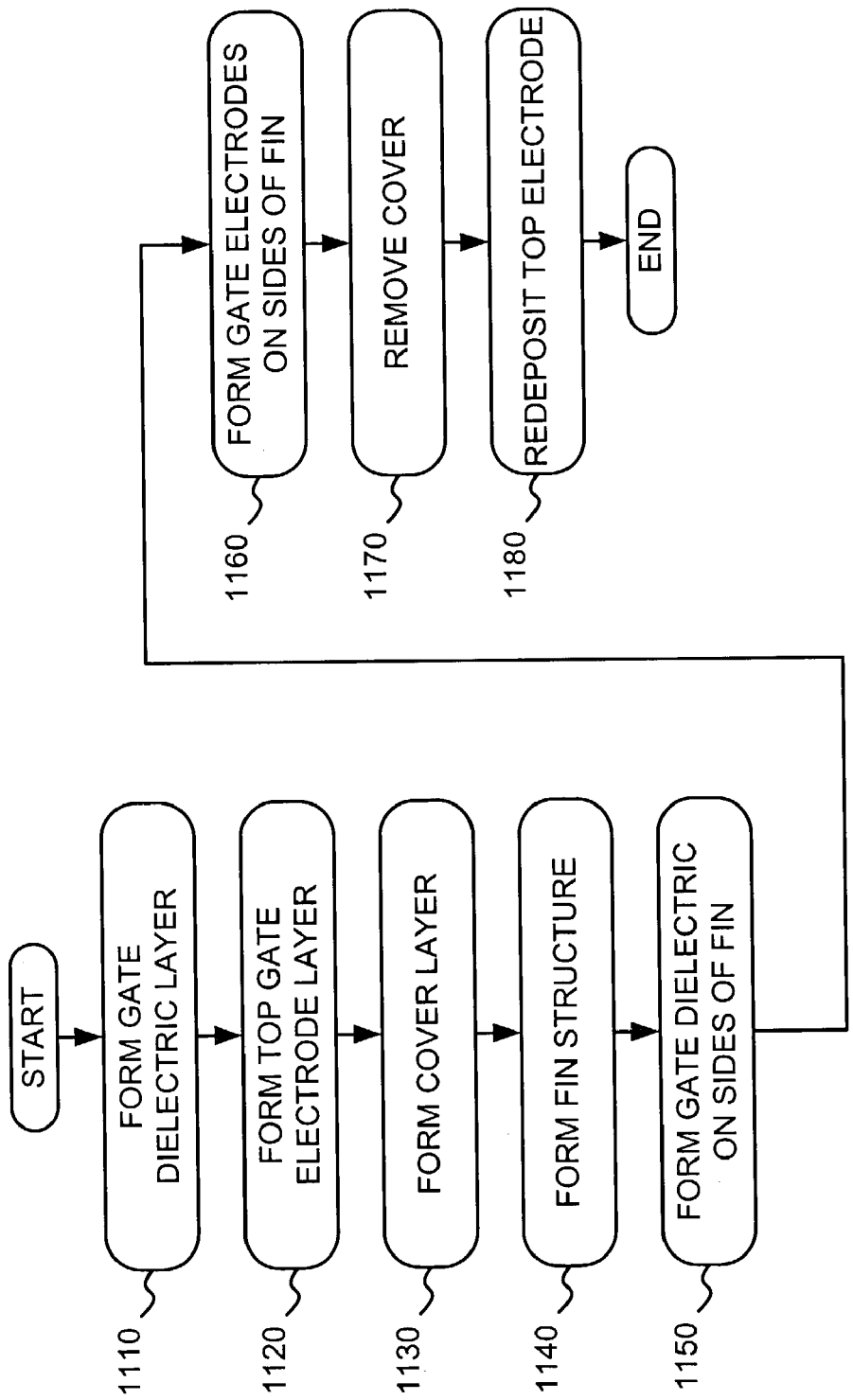
FIG. 11 illustrates an exemplary process for fabricating a germanium triple gate MOSFET in another implementation consistent with the principles of the invention.

FIG. 11 illustrates an exemplary process for fabricating a triple gate MOSFET in another implementation consistent with the principles of the invention. FIGS. 12–17 illustrate exemplary cross-sectional views of a MOSFET fabricated according to the processing described with regard to FIG. 11.

Figure 12:
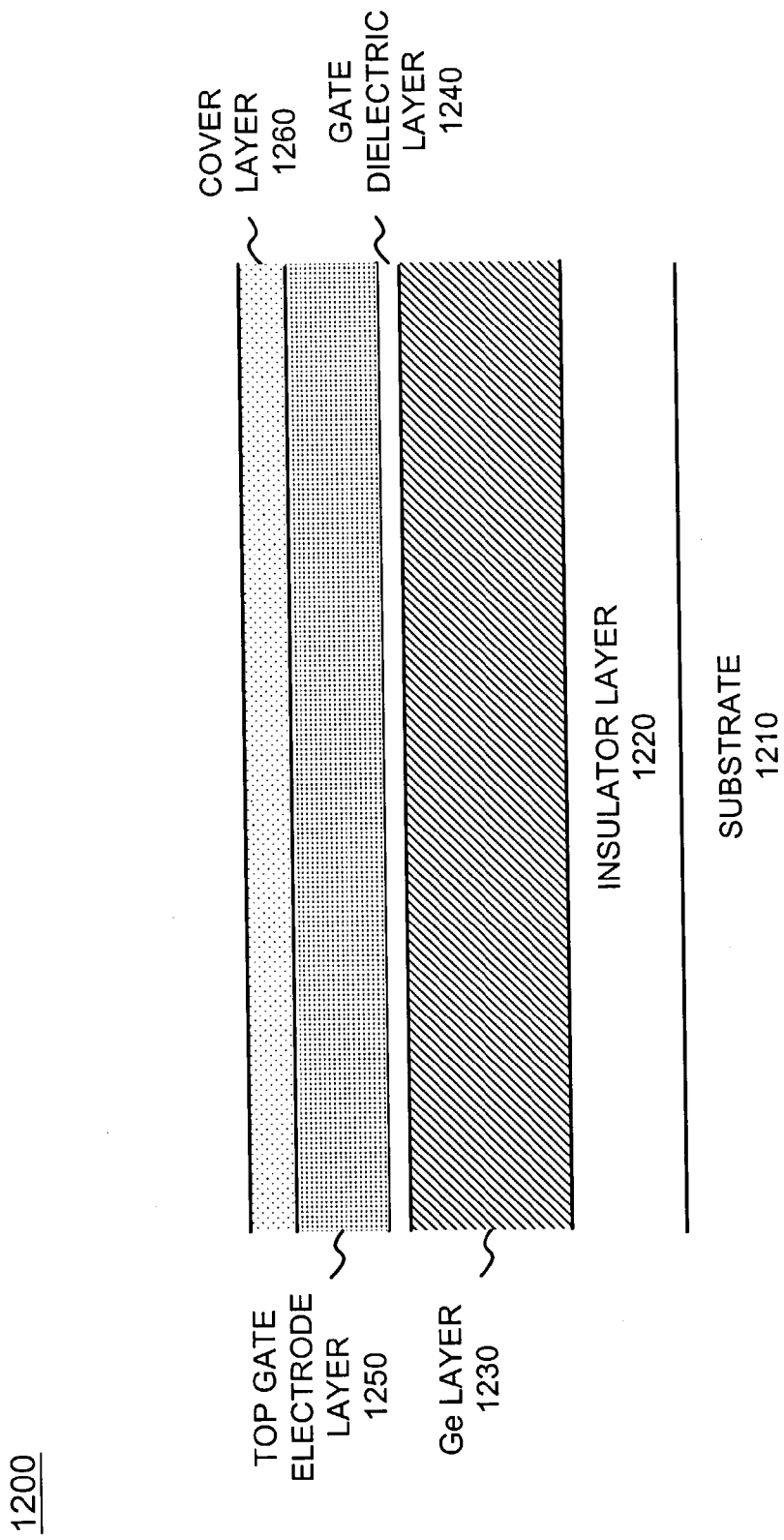
FIGS. 12–17 illustrate exemplary cross-sectional views of a germanium triple gate MOSFET fabricated according to the processing described in FIG. 11.

With reference to FIGS. 11 and 12, processing may begin with semiconductor device 1200. Semiconductor device 1200 may include a GOI structure that includes a substrate 1210, an insulator layer 1220, and a germanium (Ge) layer 1230 on the insulator layer 1220. Substrate 1210 may include a germanium substrate and insulator layer 1220 may include a buried oxide layer. Insulator layer 1220 and germanium layer 1230 may be formed on substrate 1210 in a conventional manner. The thickness of insulator layer 1220 may range, for example, from about 1000 Å to 5000 Å. The thickness of germanium layer 1230 may range from about 200 Å to 2000 Å. It will be appreciated that germanium layer 1230 is used to form the fin.

In alternative implementations, substrate 1210 may include other semiconductor materials, such as silicon, or combinations of semiconductor materials, such as silicon germanium. Insulator layer 1220 may include a silicon oxide or other types of dielectric materials.

A gate dielectric layer 1240 may be deposited or grown on germanium layer 1230 (act 1110). Gate dielectric 1240 may include a high K material (with Hf, Zr, Y, La oxide) formed by ALD or MOCVD. Alternatively, gate dielectric 1240 may include GeON. Gate dielectric layer 1240 may be formed at an EOT ranging from approximately 14 Å to 16 Å.

A top gate electrode layer 1250 may be deposited over gate dielectric layer 1240 for forming the top gate (act 1120). Gate electrode layer 1250 may be formed at a thickness ranging from approximately 1000 Å to 1500 Å. A number of conductive materials may be used for gate electrode layer 1250. For example, gate electrode layer 1250 may include a metal (e.g., tungsten, tantalum, aluminum, nickel, ruthenium, rhodium, palladium, platinum, titanium, molybdenum, etc.), a metal containing a compound (e.g., titanium nitride, tantalum nitride, ruthenium oxide, etc.), or a doped semiconductor material (e.g., polycrystalline silicon, polycrystalline silicon-germanium, etc.).

A cover layer 1260 (or hard mask) may be formed on top of gate electrode layer 1250 to aid in pattern optimization and protect top gate electrode layer 1250 during subsequent processing (act 1130). Cover layer 1260 may, for example, include a silicon nitride material or some other type of material capable of protecting the gate electrode during the fabrication process. Cover layer 1260 may be deposited, for example, by chemical vapor deposition (CVD) at a thickness ranging from approximately 200 Å to 500 Å.

Figure 13:
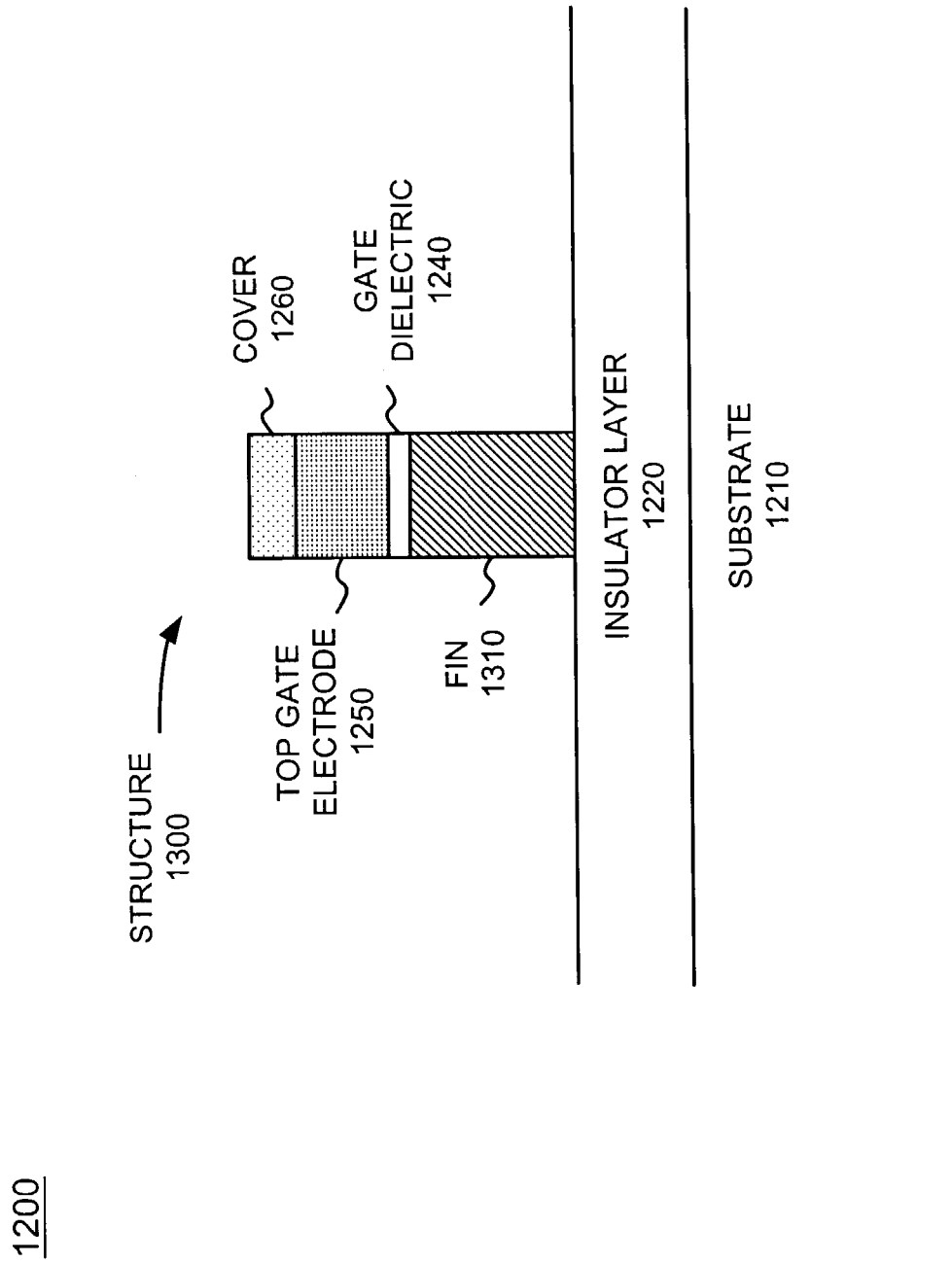

Germanium layer 1230, gate dielectric layer 1240, and top gate electrode layer 1250 may be patterned by conventional lithographic techniques (e.g., optical or electron beam (EB) lithography). Germanium layer 1230, gate dielectric layer 1240, and top gate electrode layer 1250 may then be etched using well-known etching techniques to form structure 1300, as illustrated in FIG. 13 (act 1140). Structure 1300 includes fin 1310, gate dielectric 1240, top gate electrode 1250, and cover 1260. The width of fin 1310 may range from approximately 75 Å to 350 Å.

Figure 14:
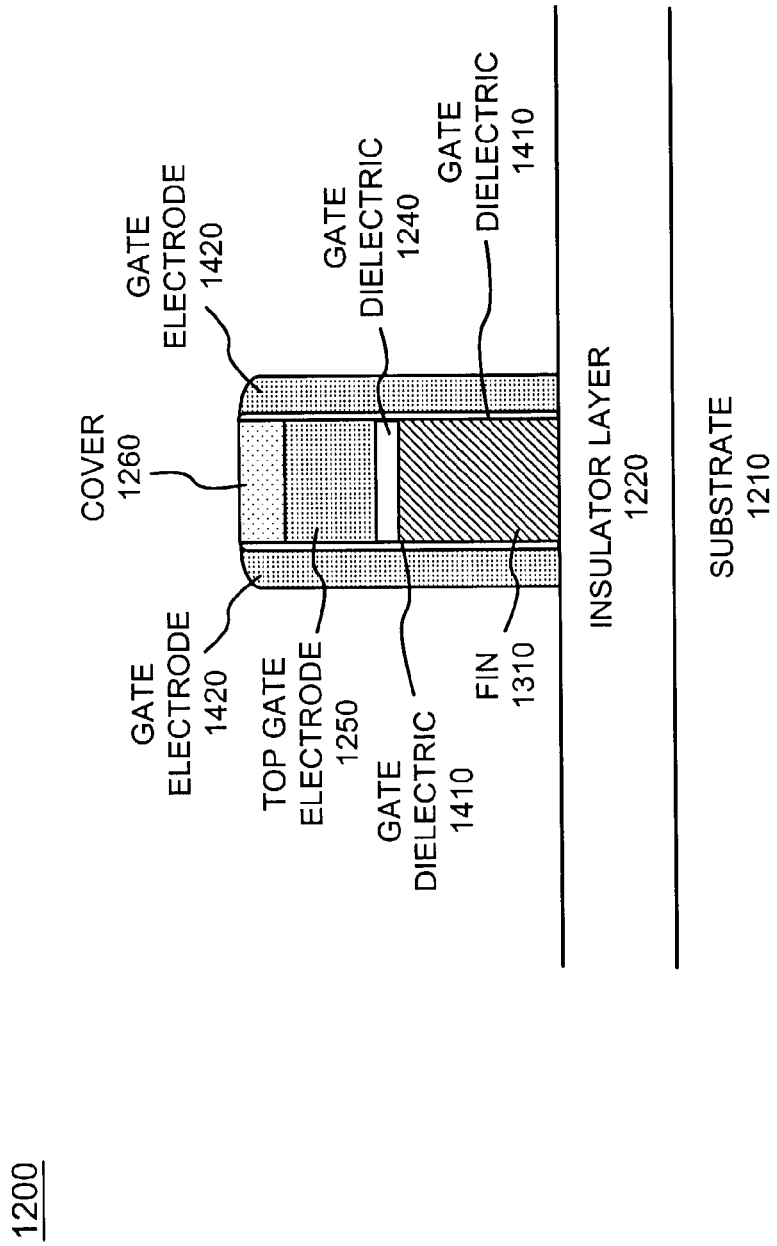

Following the formation of structure 1300, a gate dielectric layer 1410 may be deposited or grown on the side surfaces of structure 1300 using known techniques (act 1150), as illustrated in FIG. 14. Gate dielectric 1410 may include a high K material (with Hf, Zr, Y, La oxide) formed by ALD or MOCVD. Alternatively, gate dielectric 1410 may include GeON. Gate dielectric layer 1410 may be formed at an EOT ranging from approximately 6 Å to 14 Å.

A gate electrode material may then be deposited over semiconductor device 1200 to form sidewall gate electrodes 1420, as illustrated in FIG. 14. A gate electrode material may be formed at a thickness ranging from approximately 1000 Å to 1500 Å. Similar to top gate electrode layer 1250, a number of materials may be used for the sidewall gate electrode material. The sidewall gate electrode material may then be planarized, using, for example, a chemical-mechanical polishing (CMP), to expose the top surface of cover 1260 and form two separate sidewall electrodes 1420, as illustrated in FIG. 14.

Figure 15:
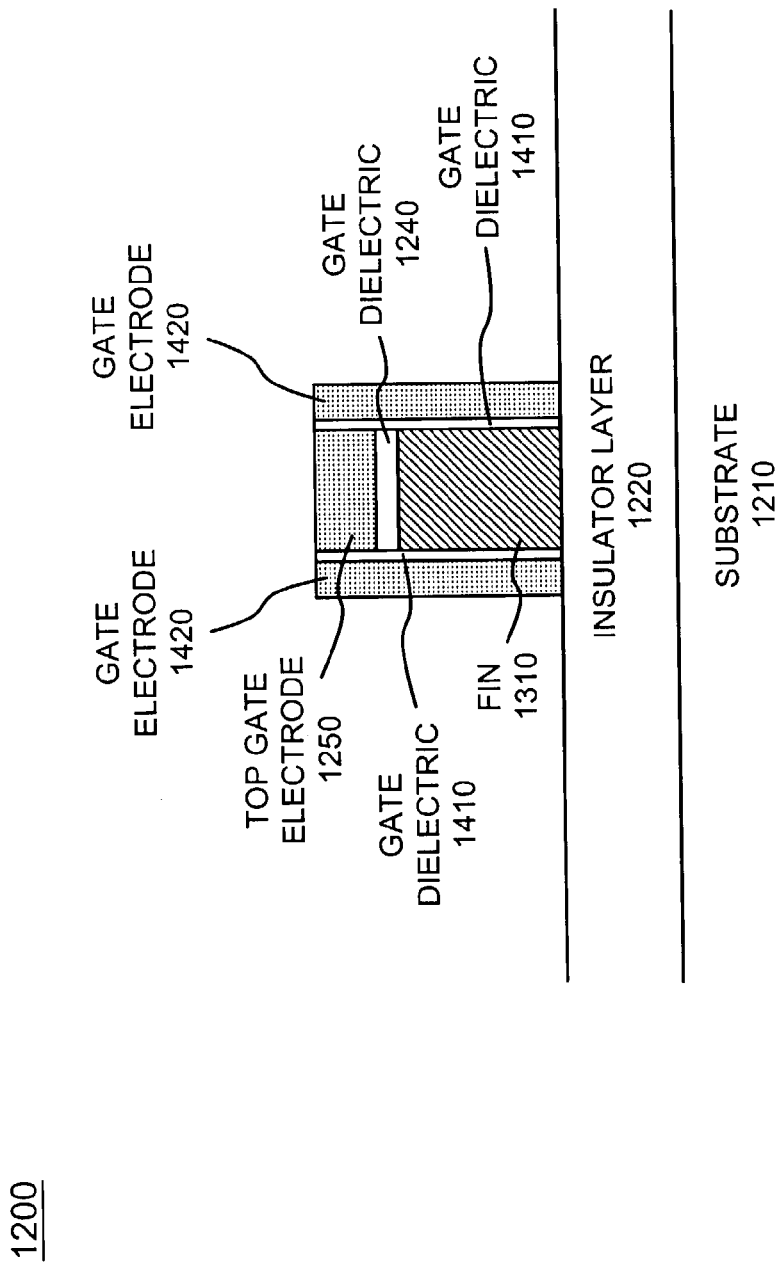

Semiconductor device 1200 may then be etched to remove cover 1260 (act 1170), as illustrated in FIG. 15. During the etching, a portion of top gate electrode 1250 may be removed. For example, in one implementation, the portion of top gate electrode 1250 that is etched ranges from approximately 1000 Å to 1500 Å.

Figure 16:
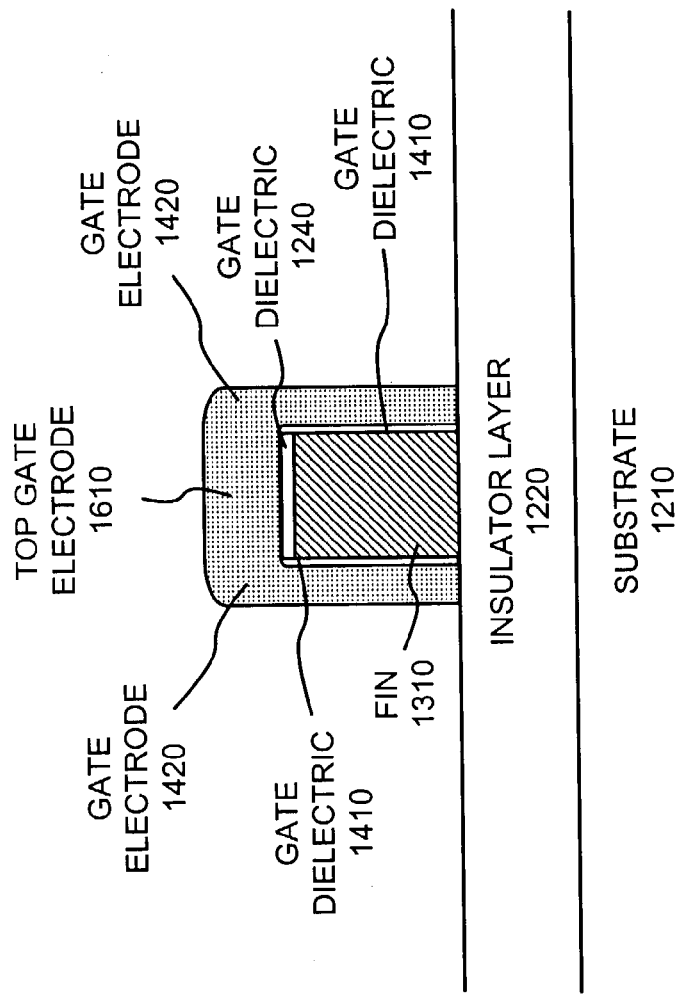

A top gate electrode material 1610 may then be formed on top of top gate electrode 1250 (act 1180), as illustrated in FIG. 16. For example, gate electrode material 1610 may optionally be deposited to connect sidewall gate electrodes 1420. Gate electrode material 1610 may include a material similar to the material used for top gate electrode 1250 and gate electrodes 1420 and may be deposited to a thickness ranging from approximately 1000 Å to 1500 Å.

Figure 17:
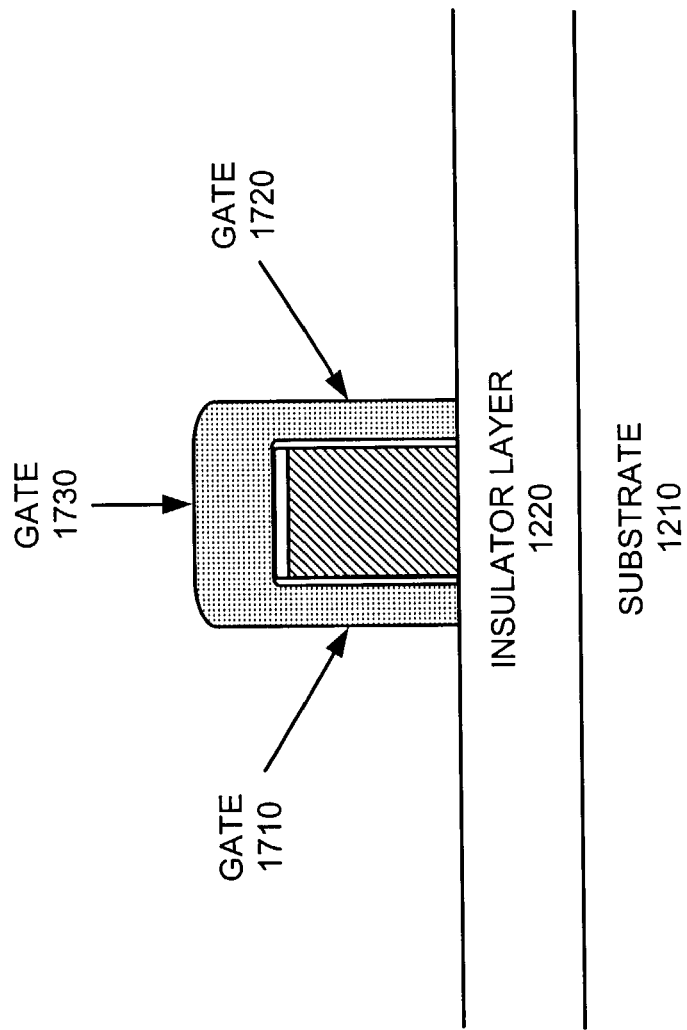

The resulting semiconductor device 1200 illustrated in FIG. 17 may include three gates (i.e., sidewall gate 1710, sidewall gate 1720, and top gate 1730). Conventional MOSFET fabrication processing can be used to complete the transistor (e.g., forming and implanting the source and drain regions), contacts, interconnects and inter-level dielectrics for the triple gate MOSFET.

Exemplary All-around Gate MOSFET

Figure 18:
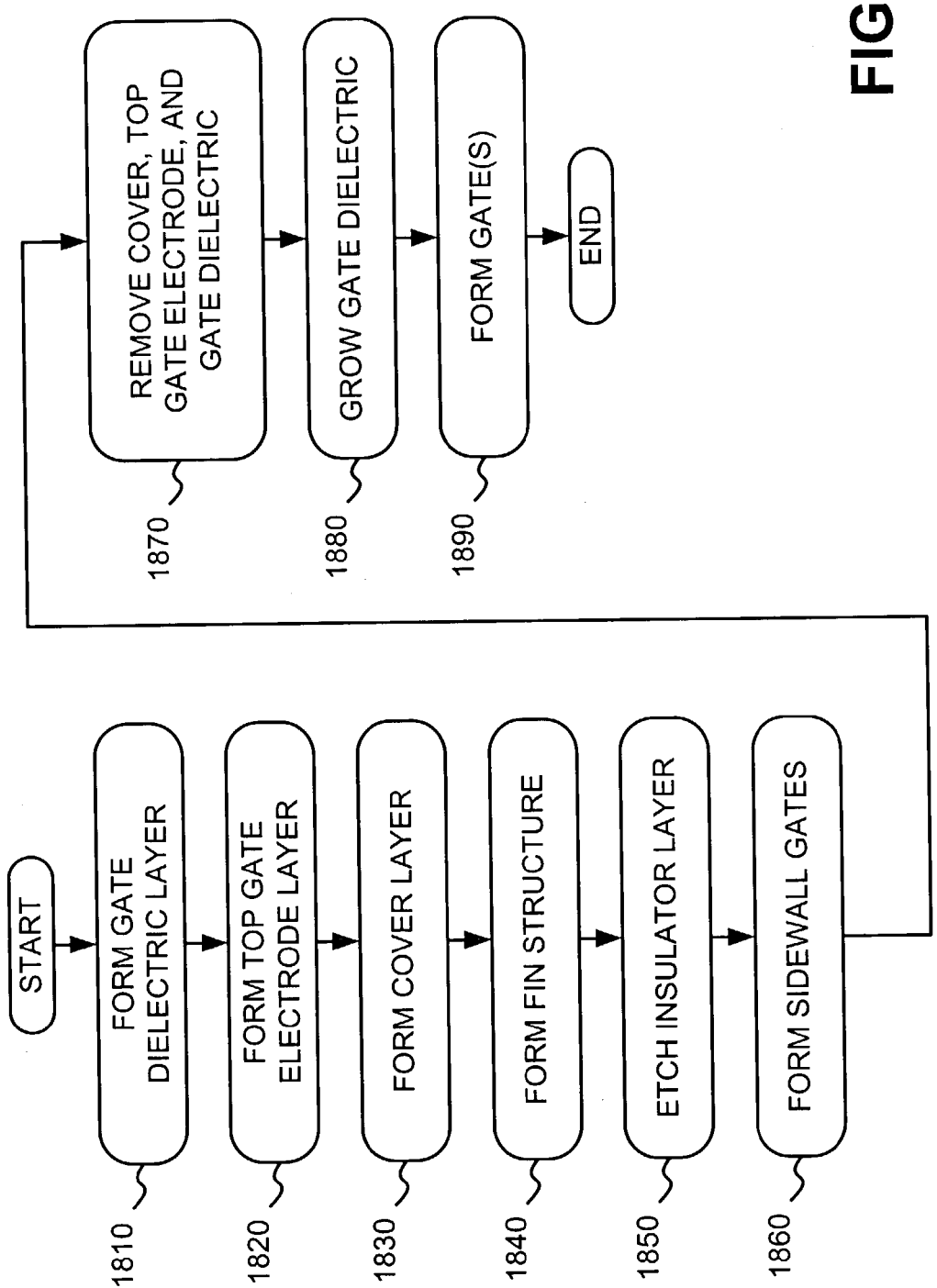
FIG. 18 illustrates an exemplary process for fabricating a germanium all-around gate MOSFET in an implementation consistent with the principles of the invention.

FIG. 18 illustrates an exemplary process for fabricating an all-around gate MOSFET in an implementation consistent with the principles of the invention. FIGS. 19–24 illustrate exemplary cross-sectional views of a MOSFET fabricated according to the processing described with respect to FIG. 18.

Figure 19:
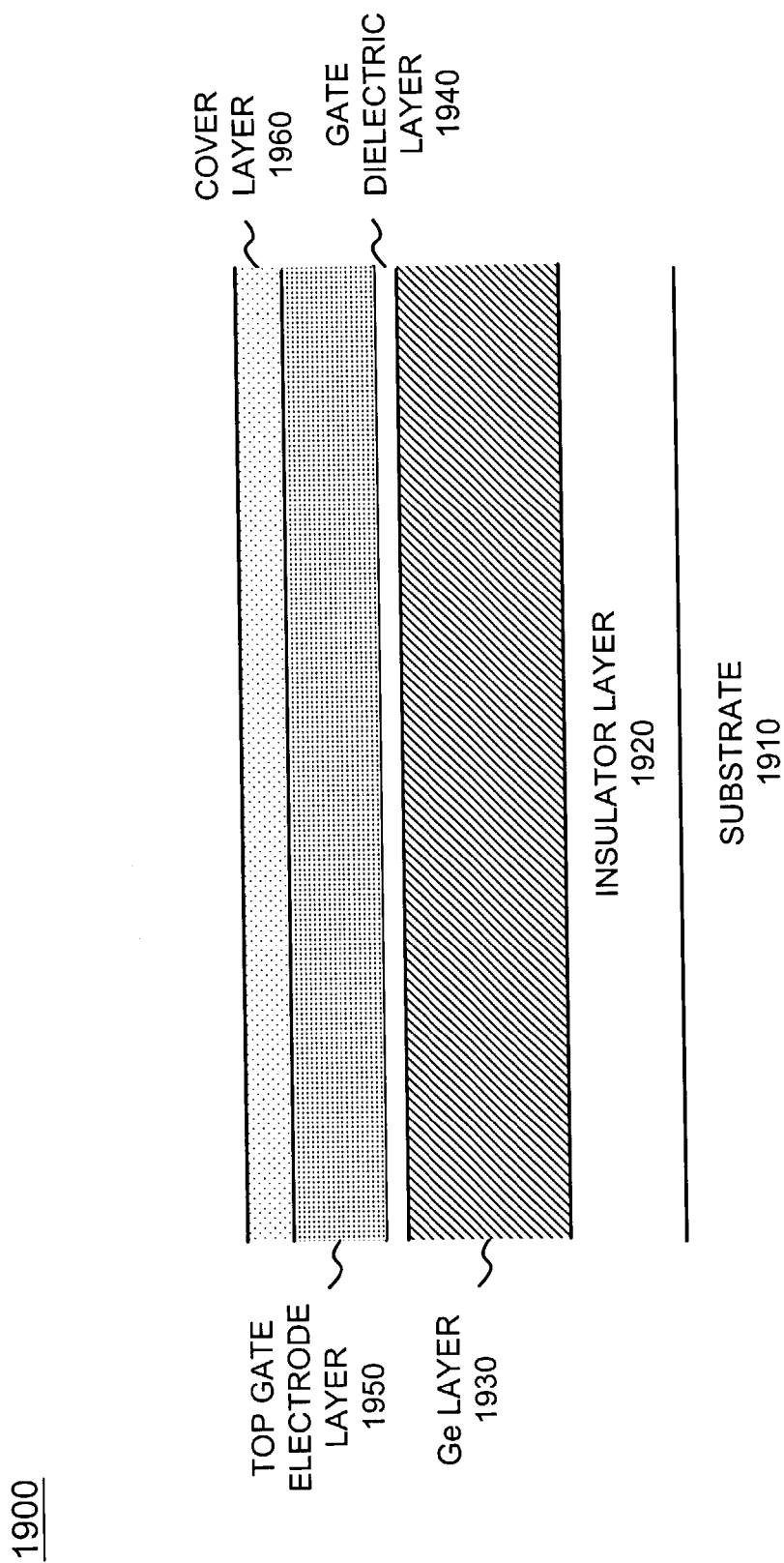
FIGS. 19–24 illustrate exemplary cross-sectional views of a germanium all-around gate MOSFET fabricated according to the processing described in FIG. 18.

With reference to FIGS. 18 and 19, processing may begin with semiconductor device 1900. Semiconductor device 1900 may include a GOI structure that includes a substrate 1910, an insulator layer 1920, and a germanium (Ge) layer 1930 on the insulator layer 1920. Substrate 1910 may include a germanium substrate and insulator layer 1920 may include a buried oxide layer. Insulator layer 1920 and germanium layer 1930 may be formed on substrate 1910 in a conventional manner. The thickness of insulator layer 1920 may range, for example, from about 1500 Å to 5000 Å. The thickness of germanium layer 1930 may range from about 200 Å to 1200 Å. It will be appreciated that germanium layer 1930 is used to form the fin.

In alternative implementations, substrate 1910 may include other semiconductor materials, such as silicon, or combinations of semiconductor materials, such as silicon germanium. Insulator layer 1920 may include a silicon oxide or other types of dielectric materials.

A gate dielectric layer 1940 may be deposited or grown on germanium layer 1930 (act 1810). Gate dielectric 1940 may include a high K material (with Hf, Zr, Y, La oxide) formed by ALD or MOCVD. Alternatively, gate dielectric 1940 may include GeON. Gate dielectric layer 1940 may be formed at an EOT ranging from approximately 6 Å to 14 Å.

A top gate electrode layer 1950 may be deposited over gate dielectric layer 1940 for forming the top gate (act 1820). Gate electrode layer 1950 may be formed at a thickness ranging from approximately 1000 Å to 1500 Å. A number of conductive materials may be used for gate electrode layer 1950. For example, gate electrode layer 1950 may include a metal (e.g., tungsten, tantalum, aluminum, nickel, ruthenium, rhodium, palladium, platinum, titanium, molybdenum, etc.), a metal containing compound (e.g., titanium nitride, tantalum nitride, ruthenium oxide, etc.), or a doped semiconductor material (e.g., polycrystalline silicon, polycrystalline silicon-germanium, etc.).

A cover layer 1960 (or hard mask) may be formed on top of gate electrode layer 1950 to aid in pattern optimization and protect top gate electrode layer 1950 during subsequent processing (act 1830). Cover layer 1960 may, for example, include a silicon nitride material or some other type of material capable of protecting the gate electrode during the fabrication process. Cover layer 1960 may be deposited, for example, by chemical vapor deposition (CVD) at a thickness ranging from approximately 250 Å to 500 Å.

Figure 20:
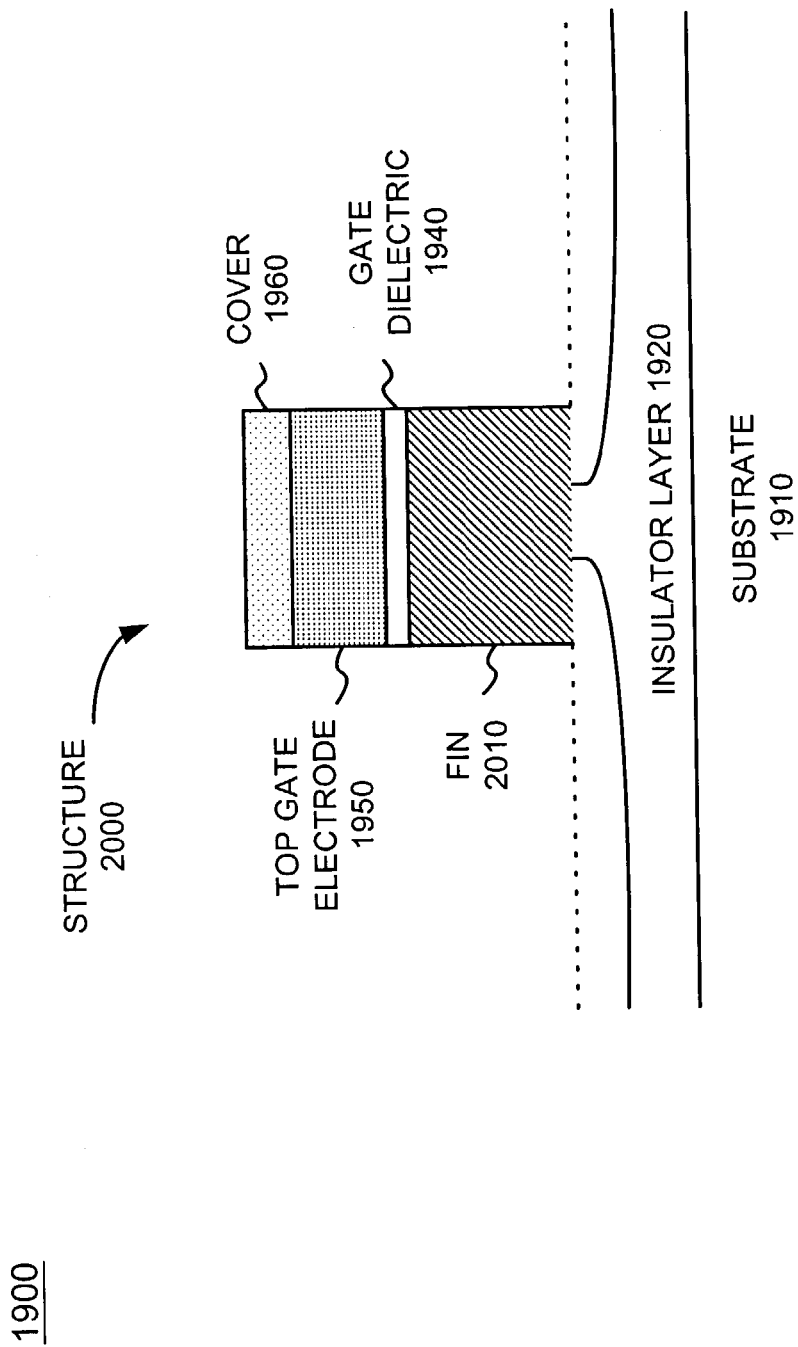

Germanium layer 1930, gate dielectric layer 1940, and gate electrode layer 1950 may be patterned by conventional lithographic techniques (e.g., optical or electron beam (EB) lithography). Germanium layer 1930, gate dielectric layer 1940, and gate electrode layer 1950 may then be etched using well-known etching techniques to form structure 2000, as illustrated in FIG. 20 (act 1840). Structure 2000 includes fin 2010, gate dielectric 1940, top gate electrode 1950, and cover 1960. The width of fin 2010 may range from approximately 100 Å to 500 Å.

Following the formation of structure 2000, a portion of insulator layer 1920 may be removed using, for example, one or more conventional etching techniques (act 1850). In one implementation, insulator layer 1920 may be etched to a depth ranging from about 200 Å to about 500 Å. During the etching, a portion of insulator layer 1920 below fin 2010 may be removed, as illustrated in FIG. 20. For example, the etched portion of insulator layer 1920 may extend laterally below fin 2010. In one implementation, the etched portion may extend laterally below fin 2010 about half of the width of fin 2010 from each of the side surfaces of fin 2010. The remaining portion of insulator layer 1920 located below fin 2010 may be as small as about 0 Å, as fin 2010 is held along the source/drain direction.

Figure 21:
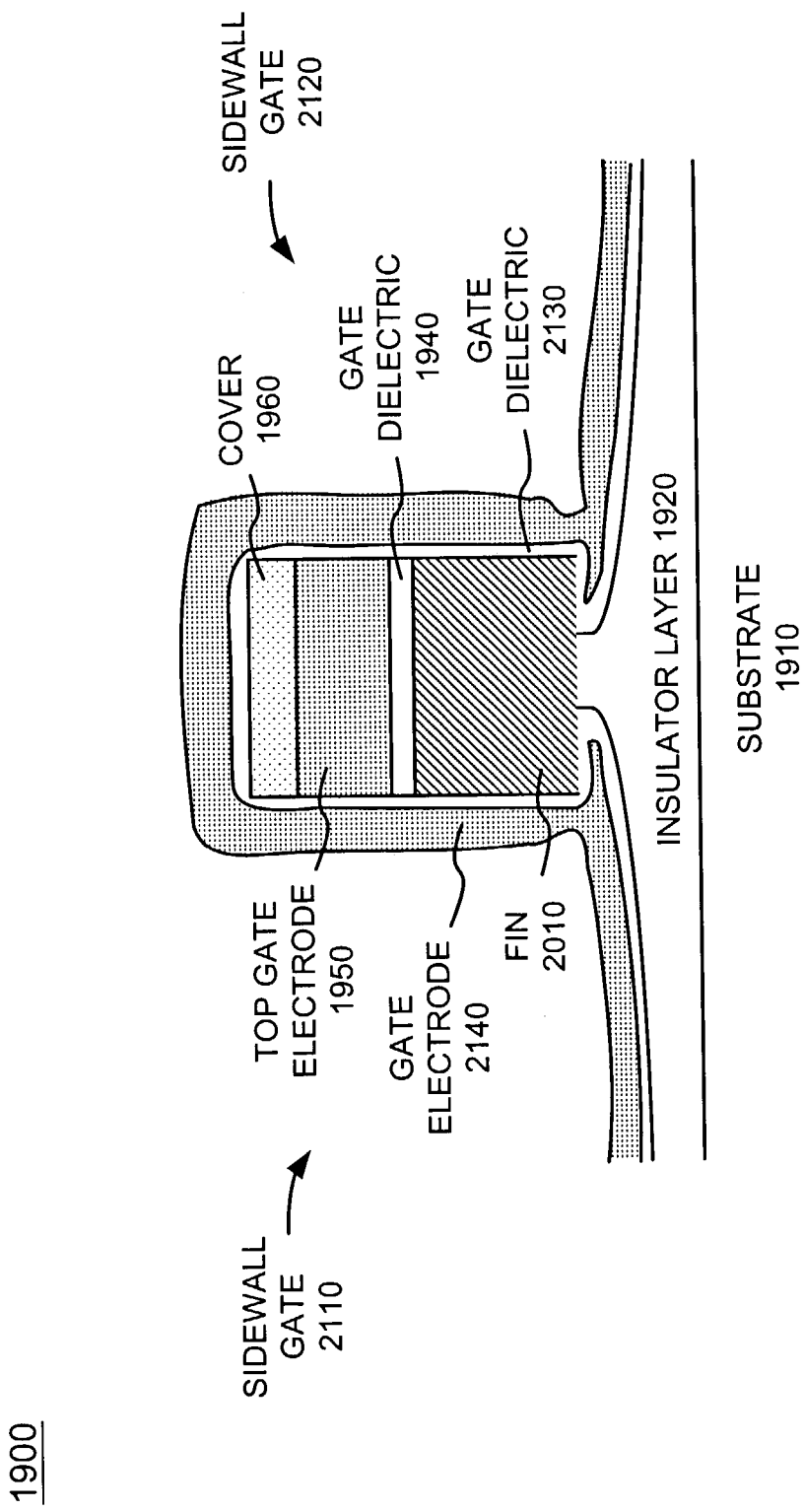

Sidewall gates 2110 and 2120 may then be formed, as illustrated in FIG. 21 (act 1860). For example, a gate dielectric layer 2130 may be deposited or grown using known techniques, such as ALD or MOCVD. Gate dielectric 2130 may include a high K material (with Hf, Zr, Y, La oxide) or GeON. Gate dielectric layer 2130 may be formed at an EOT ranging from approximately 6 Å to 14 Å.

A gate electrode layer 2140 may be deposited over semiconductor device 1900. Gate electrode layer 2140 may be formed at a thickness ranging from approximately 500 Å to 1200 Å. Similar to top gate electrode layer 1950, a number of materials may be used for gate electrode layer 2140. Gate electrode layer 2140 may optionally be planarized, using, for example, a CMP to expose the top surface of cover 1960 and form two separate sidewall gates.

Figure 22:
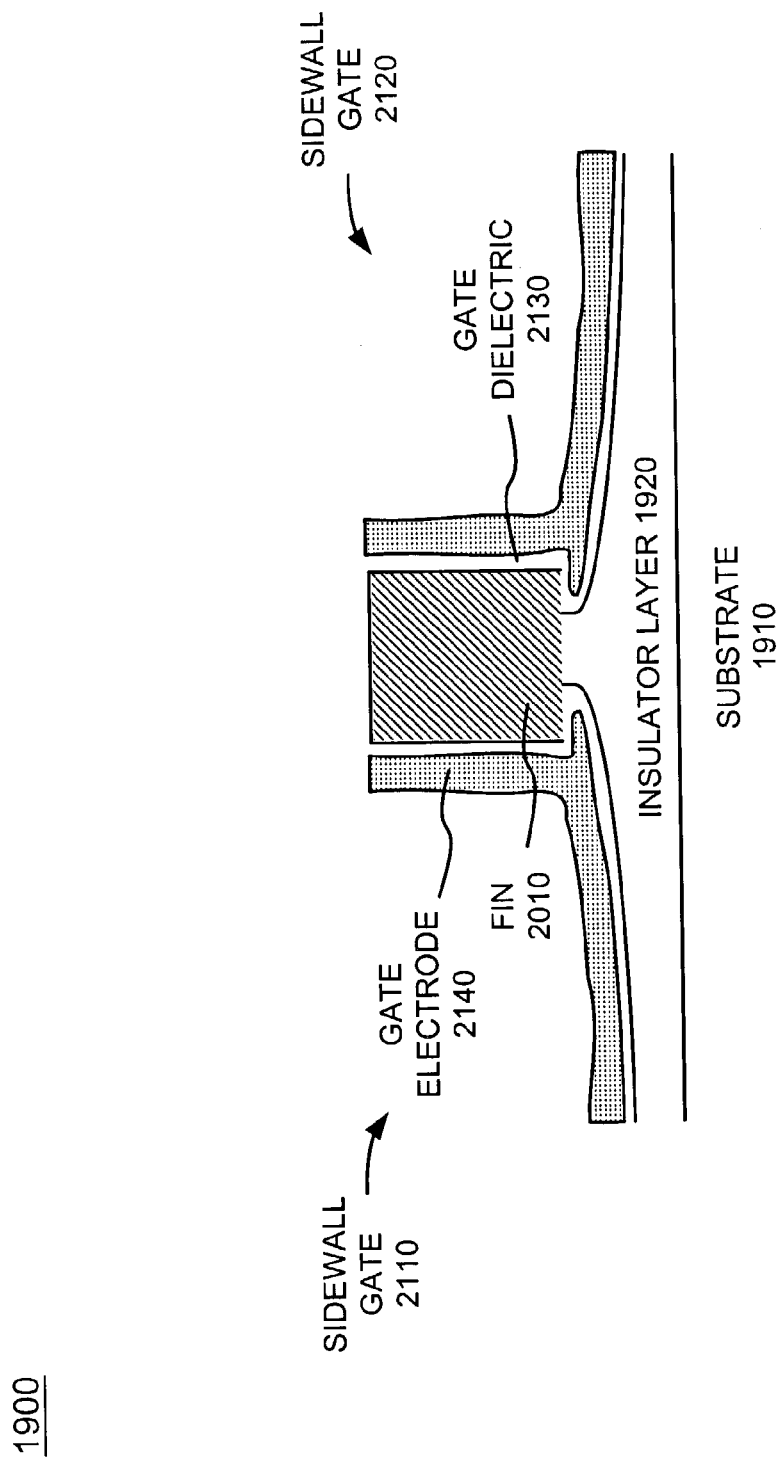

Cover 1960, top gate electrode 1950, gate dielectric 1940 may then be removed, as illustrated in FIG. 22 (act 1870). For example, a conventional etching technique may be used to remove cover 1960, top gate electrode 1950, and gate dielectric 1940, while minimizing effects to sidewall gates 2110 and 2120.

Figure 23:
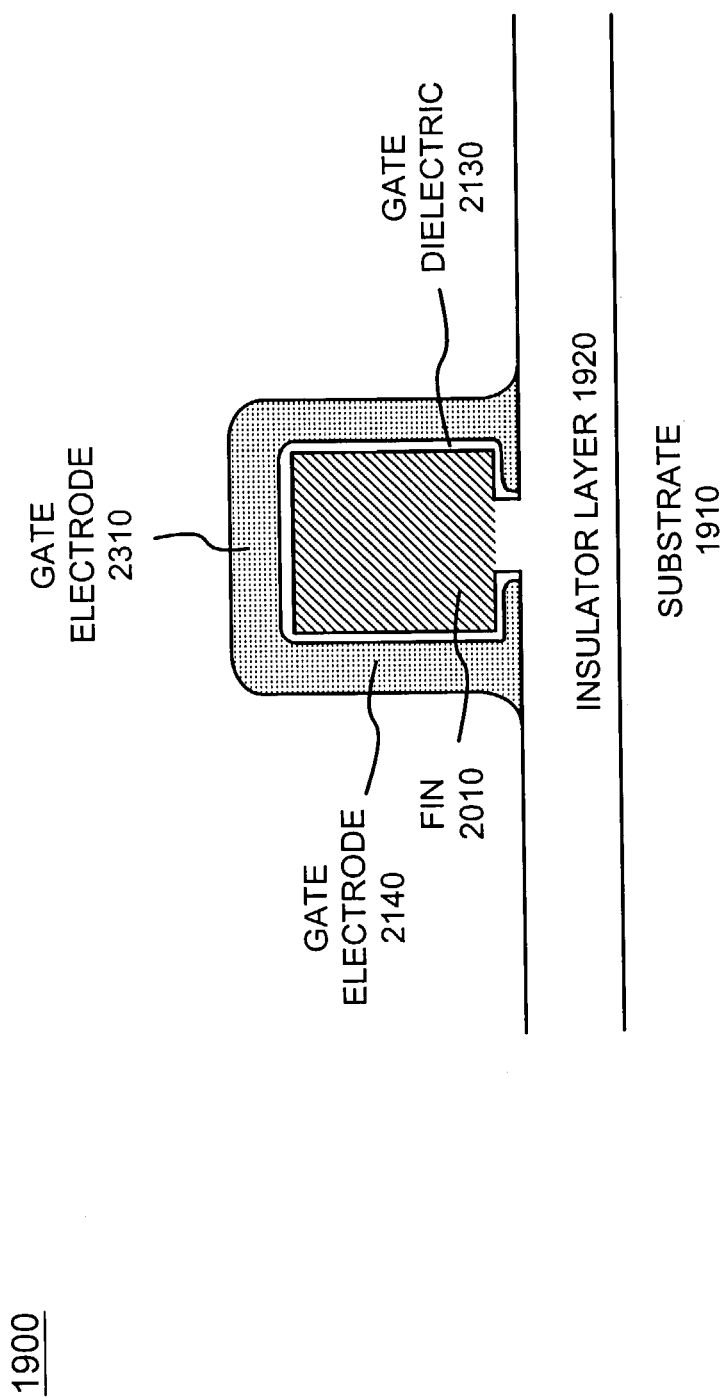

Gate dielectric 2130 may then be grown or otherwise formed on the exposed surface(s) of fin 2010 (act 1880), as illustrated in FIG. 23. Gate dielectric 2130 may include a high K material (with Hf, Zr, Y, La oxide) formed by ALD or MOCVD. Alternatively, gate dielectric 2130 may include GeON. Gate dielectric 2130 may be grown to a thickness of about 6 Å to about 14 Å.

Additional gates may then be formed (act 1890). For example, gate electrode material 2310 may be deposited over gate dielectric material 2130 and fin 2010, possibly connecting sidewall gates 2110 and 2120. Gate electrode material 2310 may include a material similar to the material used for sidewall gate electrode layer 2140 and may be deposited to a thickness ranging from approximately 1000 Å to 1500 Å. Gate electrode material 2310 may then be patterned and etched to form a top gate 2410 and a bottom gate 2420, as illustrated in FIG. 24.

Figure 24:
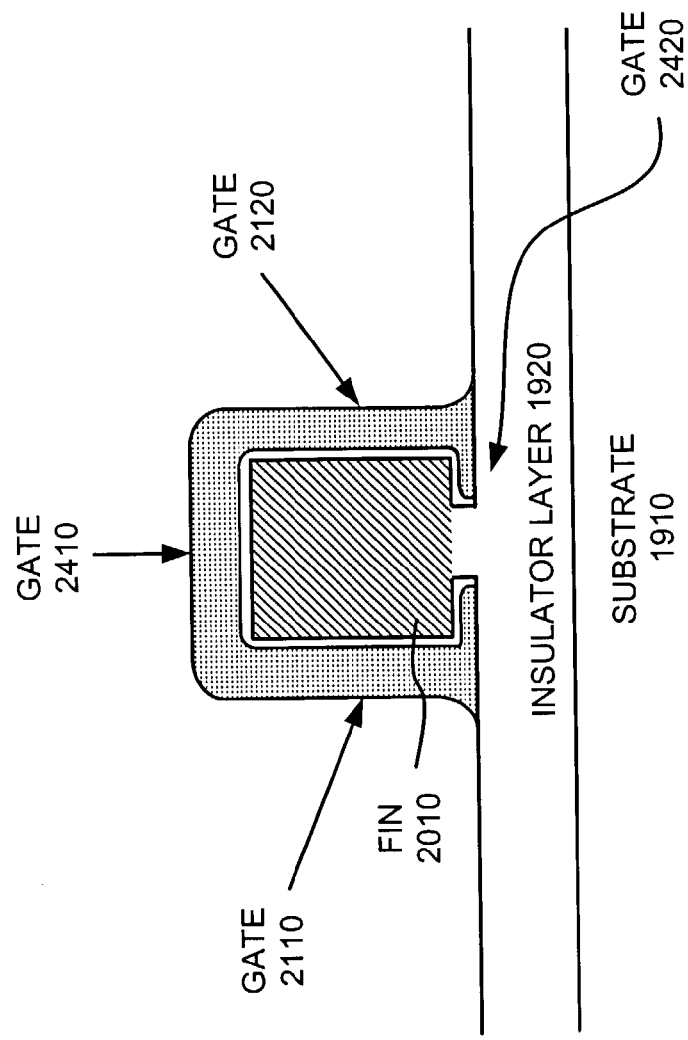

The resulting semiconductor device 1900 has an all-around gate structure, with the gate material essentially surrounding fin 2010, as illustrated in FIG. 24. Only a small portion of insulator layer 1920 located below fin 2010 may remain, with the rest of fin 2010 being surrounded by the gate material. The all-around gate structure may include four (or more) gates (i.e., sidewall gate 2110, sidewall gate 2120, top gate 2410, and bottom gate 2420), as illustrated in FIG. 24. Conventional MOSFET fabrication processing can be used to complete the transistor (e.g., forming and implanting the source and drain regions), contacts, interconnects and inter-level dielectrics for the all-around gate MOSFET.

Other Implementations

Figure 25:
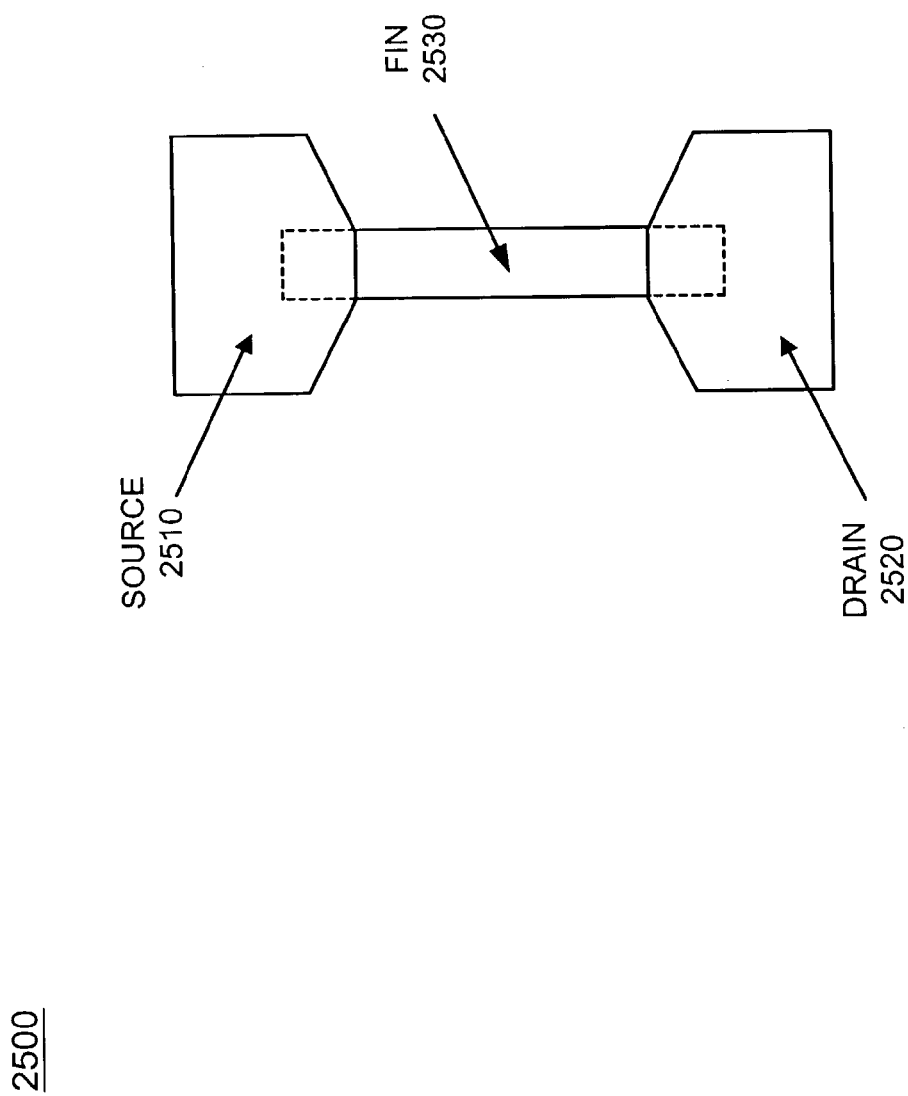
FIGS. 25–27 illustrate an exemplary process for thinning a FinFET channel.
Figure 26:
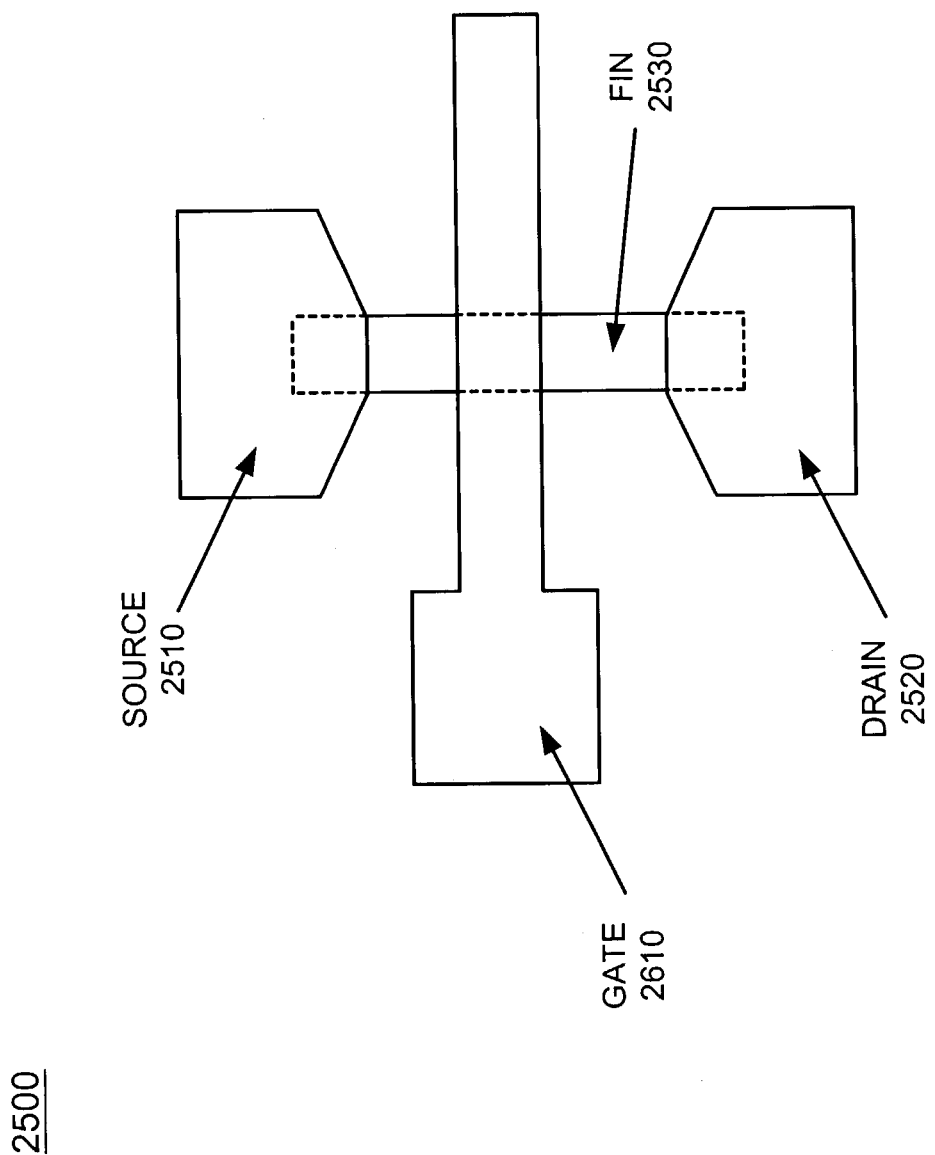
Figure 27:
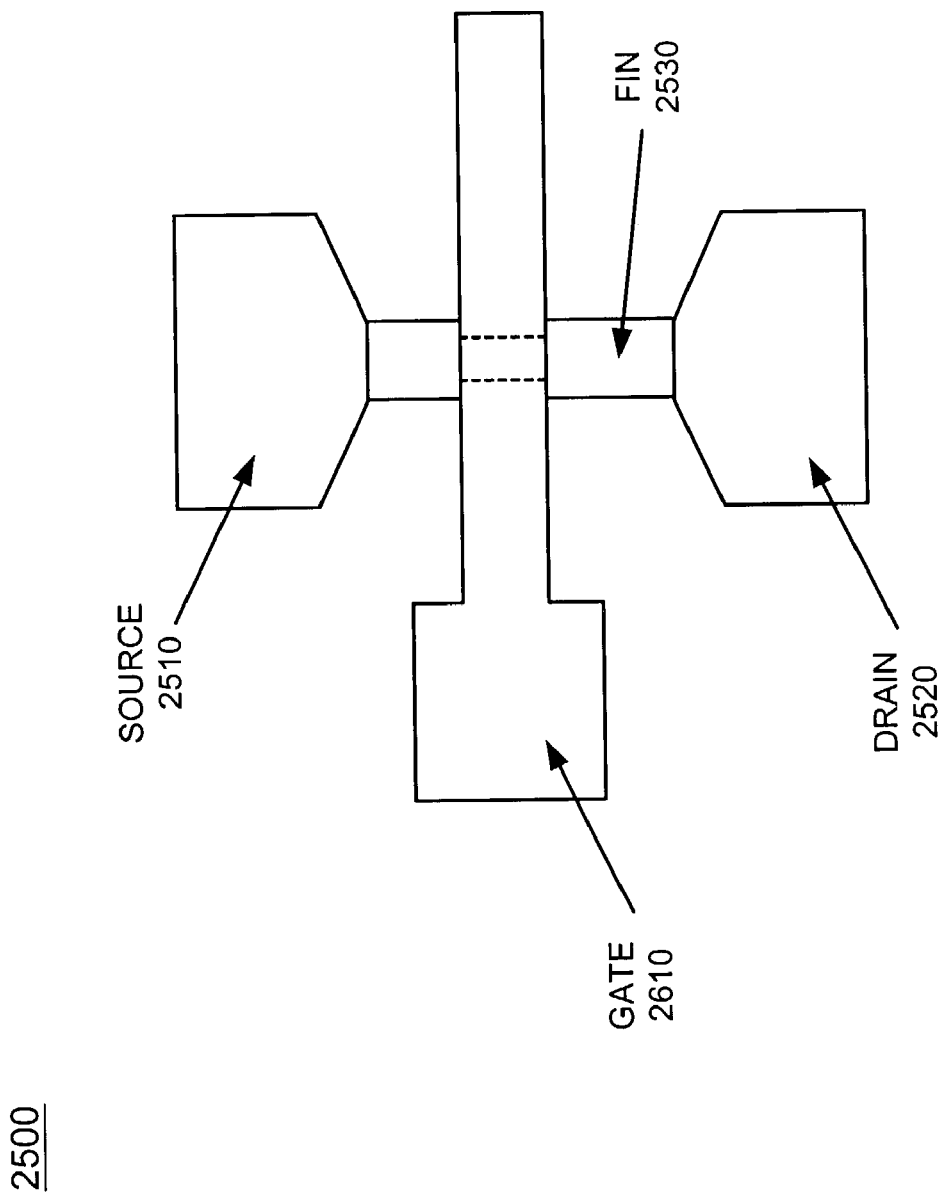

There is a need in the art for a process for thinning a FinFET channel. This process may be performed after a damascene gate pattern and etch, but before the gate material is deposited. FIGS. 25–27 illustrate an exemplary process for thinning a FinFET channel. As shown in the top view in FIG. 25, a semiconductor device 2500 may include a source region 2510 and a drain region 2520 connected by a fin 2530. Source region 2510, drain region 2520, and fin 2530 may be formed using conventional techniques.

Gate region 2610 may then be patterned and etched, as shown in FIG. 26. To form the gate, a gate damascene oxide deposition may be performed and a gate opening defined. An isotropic fin etch may then be performed to reduce the exposed fin height and width, as shown by the dotted lines in FIG. 27. The fin height may be reduced from approximately 200–350 Å to 100–200 Å. The fin width may be reduced from approximately 30 Å to 100 Å.

Figure 28:
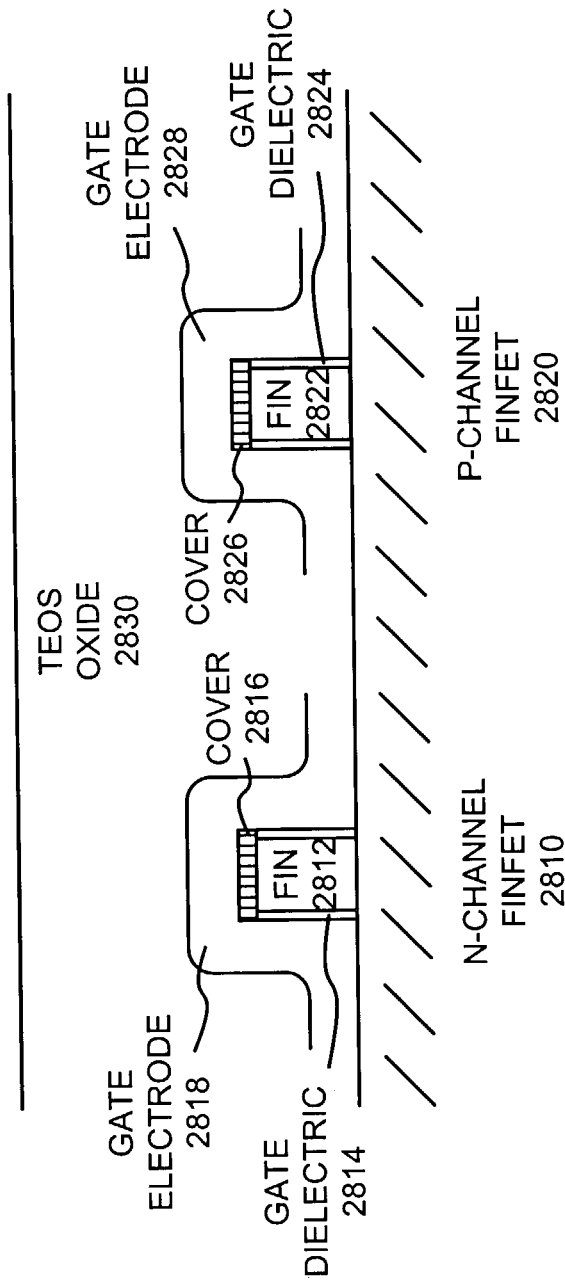
FIGS. 28 and 29 illustrate an exemplary process for providing local stress engineering.
Figure 29:
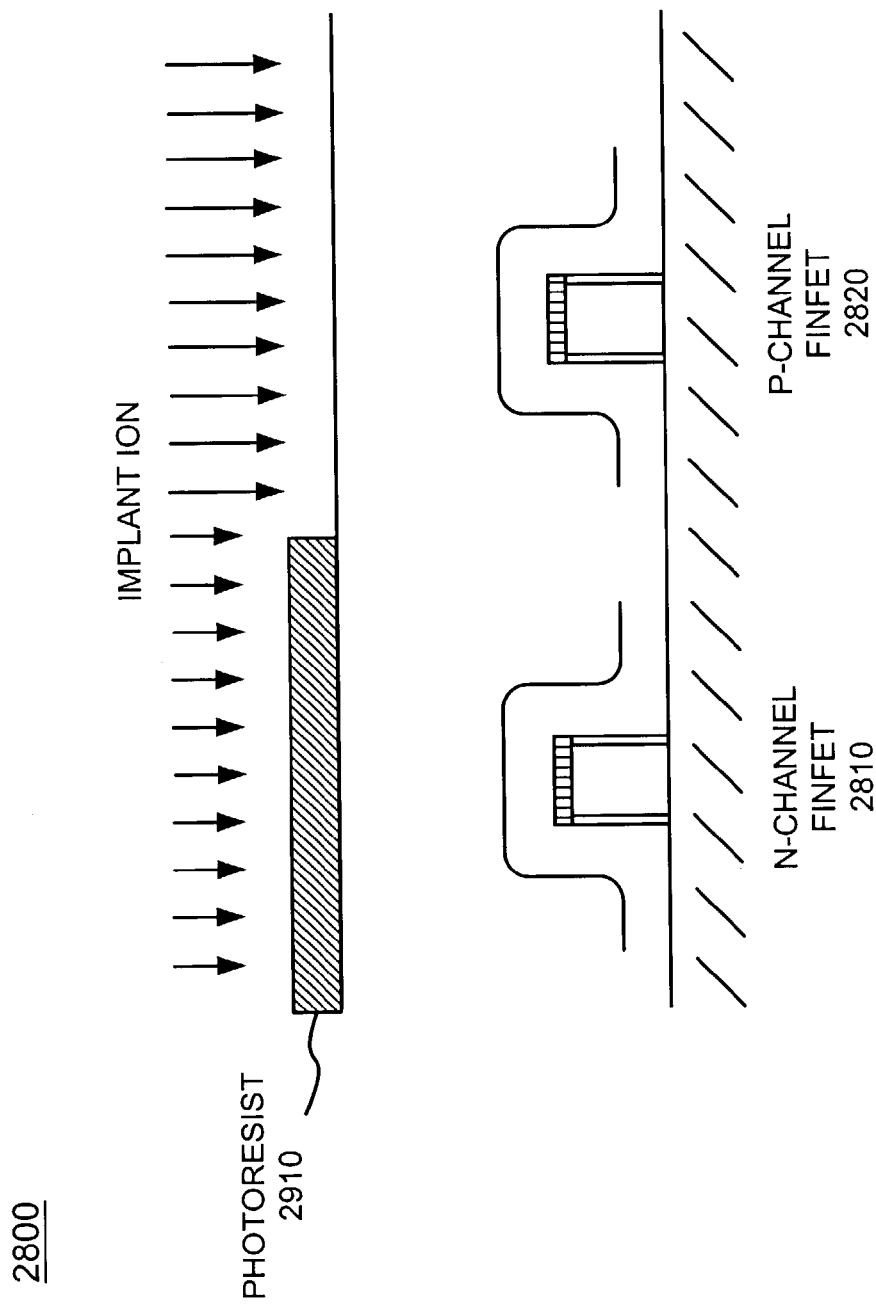

Normally, tensile stress helps increase electron mobility, but degrades hole mobility. Compressive stress does the opposite. Therefore, there is also a need in the art for local stress engineering for a double gate MOSFET. FIGS. 28 and 29 illustrate an exemplary process for providing local stress engineering. As shown in FIG. 28, semiconductor device 2800 includes an n-channel FinFET 2810 and a p-channel FinFET 2820 formed on a buried oxide layer in a conventional manner.

N-channel FinFET 2810 may include a fin 2812, a gate dielectric 2814 formed on the side surfaces of fin 2812, a cover 2816 formed on the top of fin 2812, and a gate electrode 2818 formed covering fin 2812. P-channel FinFET 2820 may include a fin 2822, a gate dielectric 2824 formed on the side surfaces of fin 2822, a cover 2826 formed on the top of fin 2822, and a gate electrode 2828 formed covering fin 2822. A Tetraethyl Orthosilicate (TEOS) layer 2830 may be formed covering n-channel FinFET 2810 and p-channel FinFET 2820.

A photoresist 2910 may be formed covering, for example, n-channel FinFET 2810, as shown in FIG. 29. An ion, such as $N^+$, $Xe^+$, etc., may be implanted to release stress from p-channel FinFET 2820, while keeping the stress on n-channel FinFET 2810. In an alternate implementation, photoresist 2910 may be formed covering p-channel FinFET 2820.

CONCLUSION

Implementations consistent with the principles of the invention provide double, triple, and all-around gate germanium FinFET devices and methods of manufacturing these devices.

The foregoing description of exemplary embodiments of the present invention provides illustration and description, but is not intended to be exhaustive or to limit the invention to the precise form disclosed. Modifications and variations are possible in light of the above teachings or may be acquired from practice of the invention.

For example, in the above descriptions, numerous specific details are set forth, such as specific materials, structures, chemicals, processes, etc., in order to provide a thorough understanding of implementations consistent with the present invention. These implementations and other implementations can be practiced, however, without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While series of acts have been described with regard to FIGS. 1, 6, 11, and 18, the order of the acts may be varied in other implementations consistent with the present invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the claims and their equivalents.

What is claimed is:

1. A double gate germanium metal-oxide semiconductor field-effect transistor (MOSFET), comprising:
   a germanium fin;
   a cover layer formed on an upper surface of the germanium fin;
   a first gate formed adjacent a first side of the germanium fin and comprising a first layer of material having an upper surface that is substantially co-planar with an upper surface of the cover layer and a lower surface that is substantially co-planar with a lower surface of the germanium fin, the first layer having a substantially uniform thickness that extends laterally from the first side of the germanium fin; and
   a second gate formed adjacent a second side of the germanium fin opposite the first side and comprising a second layer of material having an upper surface that is substantially co-planar with the upper surface of the cover layer and a lower surface that is substantially co-planar with the lower surface of the germanium fin, the second layer having a substantially uniform thickness that extends laterally from the second side of the germanium fin,
   wherein each of the first and second gates comprise a thickness ranging from approximately 1200 Å to 1500 Å.

2. The double gate MOSFET of claim 1, wherein the germanium fin has a width of approximately 30 Å to 350 Å.

3. The double gate MOSFET of claim 1, wherein the germanium fin is formed on a buried oxide layer.

4. The double gate MOSFET of claim 1, wherein the germanium fin electrically separates the first and second gates.

5. The double gate MOSFET of claim 1, wherein the first and second gates comprise at least one of nickel, ruthenium, rhodium, palladium, platinum, or titanium.

6. The double gate MOSFET of claim 1, wherein the first and second gates comprise at least one of tantalum nitride, or ruthenium oxide.

* * * * *